(12) United States Patent
Chou et al.

(10) Patent No.: US 10,275,244 B2
(45) Date of Patent: Apr. 30, 2019

(54) EVENT-DRIVEN DESIGN SIMULATION

(71) Applicant: MONTANA SYSTEMS INC., Rolling Hills Estates, CA (US)

(72) Inventors: Vivian Chou, Rancho Palos Verdes, CA (US); Julien Lamoureux, Vancouver (CA); Sherman Lee, Rancho Palos Verdes, CA (US)

(73) Assignee: Montana Systems Inc., Rolling Hills Estates, CA (US)

( * ) Notice: Subject to any disclaimer, the term of this patent is extended or adjusted under 35 U.S.C. 154(b) by 120 days.

(21) Appl. No.: 15/400,001

(22) Filed: Jan. 6, 2017

(65) Prior Publication Data

US 2017/0255730 A1 Sep. 7, 2017

Related U.S. Application Data

(60) Provisional application No. 62/304,110, filed on Mar. 4, 2016.

(51) Int. Cl.
| | |
|---|---|
| *G06F 9/30* | (2018.01) |
| *G06F 17/50* | (2006.01) |
| *G06F 9/38* | (2018.01) |
| *G06F 12/02* | (2006.01) |

(52) U.S. Cl.
CPC .......... *G06F 9/3001* (2013.01); *G06F 9/3005* (2013.01); *G06F 9/30029* (2013.01); *G06F 9/30043* (2013.01); *G06F 9/30145* (2013.01); *G06F 9/3802* (2013.01); *G06F 9/3838* (2013.01); *G06F 9/3851* (2013.01); *G06F 9/3885* (2013.01); *G06F 12/023* (2013.01); *G06F 17/5022* (2013.01); *G06F 17/5027* (2013.01); *G06F 17/5036* (2013.01); *G06F 17/5068* (2013.01); *G06F 2212/251* (2013.01)

(58) Field of Classification Search
CPC ........ G06F 9/38; G06F 9/3802; G06F 9/3001; G06F 17/5022; G06F 17/5027; G06F 17/5036; G06F 17/5068
See application file for complete search history.

(56) References Cited

U.S. PATENT DOCUMENTS

| | | | | |
|---|---|---|---|---|
| 8,549,258 | B2 * | 10/2013 | Lee | ........................ G06F 9/3824 712/15 |
| 2014/0282312 | A1 * | 9/2014 | Stamness | ............ G06F 17/5022 716/106 |

* cited by examiner

*Primary Examiner* — Stacu Whitmore
(74) *Attorney, Agent, or Firm* — J.H. Lin Patent Law P.C.; John H. Lin

(57) ABSTRACT

A simulation system that includes a simulation accelerator that uses parallel processing to accelerate the simulation of register transfer level codes (RTLs) while minimizing memory access latency is disclosed. The accelerator has an array of parallel computing resources. The simulation accelerator receives compiled RTLs in which the components of the design are mapped to instructions. The instructions are divided into groups, in which instructions belonging to a same group are logically independent of each other. The simulation accelerator fetches instructions and data for processing by the parallel computing resources for one group of instructions at a time.

20 Claims, 29 Drawing Sheets

At time 1000 ns:

At time 1003 ns:

340 — Event Time Wheel

At time 1003 ns:        At time 1010 ns:

Group 7   Group 8       Group 1 aa.0=0    gg.0=0        O.1=1
bb.0=1    jj.0=1        T.2 =0
cc.2=0
dd.0=1

• • •

320 — Data Memory

Group 7      Group 8      Group 9      Group 10     Group 11 aa={0}       gg={0}       qq={1}       rr={0,1}     xx={1}
bb={1}       hh={1}       ww={1}       tt={1}       yy={1,0}
cc={0,0}     ii={1}       ee={0,1}     pp={0,1}     zz={0,0}
dd={1}       jj={1}

• • •

330 — Event Table

Group 7      Group 8      Group 9      Group 10     Group 11 aa:☒         gg:☒         qq:☐         rr: ☐☐       xx:☐ bb:☒         hh:☐         ww:☐         tt: ☐        yy:☐☐ cc:☐☒        ii: ☐        ee:☐☐        pp:☐☐        zz:☐☐ dd:☒         jj: ☒

*Figure 13b*

EVENT-DRIVEN DESIGN SIMULATION

CLAIM OF BENEFIT TO PRIOR APPLICATIONS

The present application claims the benefit of U.S. Provisional Patent Application 62/304,110, titled "Event-Driven Processor", filed Mar. 4, 2016. U.S. Provisional Patent Application 62/304,110 is incorporated herein by reference.

BACKGROUND

Verification of design by simulation is a key component of the engineering process for building complex hardware such as integrated circuits (ICs). Design simulation helps engineers verify and validate the intended function of a product under development, as well as the manufacturability of the product.

SUMMARY

Some embodiments of the disclosure provide a simulation system configured to test a design by operating a testbench for the design. The simulation system includes a simulation storage, a simulation processor, and a simulation accelerator. The simulation processor is configured to (i) transport compiled design data from a host computing system to the simulation storage, the compiled design data comprising compiled register transfer levels (RTLs) of the design and compiled models of the testbench and (ii) execute the compiled models to generate stimulus for testing the compiled RTLs. The simulation accelerator is configured to execute the compiled RTLs by using the stimulus generated by the simulation processor. The simulation processor is operating an operating system for managing file transfer between the simulation system and the host computing system.

Some embodiments of the disclosure provide a computing device. The computing device is configured to receive a specification of a digital circuit, the specification describing structures and behaviors of the digital circuit. The computing device is configured to compile the specification into a plurality of instructions, each instruction receiving a set of inputs and producing a set of outputs. The computing device is further configured to identify logical and temporal dependencies among the plurality of instructions and divides the plurality of instructions into a plurality of groups of instructions based on the identified logical and temporal dependencies. Each instruction belonging to a group of instructions is logically and temporally independent of any other instruction belonging to the group.

Some embodiments of the disclosure provide a method for simulating a design. The method receives a specification of a digital circuit, the specification comprising a plurality of instructions that are divided into a plurality of groups of instructions. Each instruction belonging to a group of instructions is logically and temporally independent of any other instruction belonging to the group. The method selects a group of instructions and executes the selected group of instructions by executing multiple instructions in the group in parallel by using multiple computing resources. In some embodiments, the method stores the plurality of groups of instructions at a set of dynamic random access memories (DRAMs), each DRAM having a plurality of pages. For each DRAM, instructions belonging to a same group are stored in a same page of the DRAM. The method selects a group of instructions and executes the selected group of instructions by selecting a page storing instructions of the selected group from each DRAM and retrieving the instructions of the selected group from the selected page.

Some embodiments provide an integrated circuit (IC) that includes an array of processors and an array of physical routing channels. Each routing channel is a dedicated channel for coupling a processor with a corresponding memory structure. The array of processors receives a specification of a digital circuit. The specification includes a plurality of instructions that are divided into a plurality of groups of instructions. Each instruction belonging to a group of instructions is logically and temporally independent of any other instruction belonging to the group. The array of processors selects a group of instructions and executes the selected group of instructions. Each processor in the array of processors retrieves and executes a different subset of the instructions in the selected group of instructions from the processor's corresponding memory structure through the processor's dedicated routing channel in the array of routing channels.

Some embodiments of the disclosure provide a method for simulating a design. The method receives a specification of a digital circuit. The specification includes a plurality of instructions that are sorted into a plurality of groups of instructions. Each instruction belonging to a group of instructions is logically and temporally independent of any other instruction belonging to the group. The method maintains a pending events table. Each word of the pending events table has a plurality of bits, each bit indicating absence or presence of pending input event at an instruction in the plurality of instructions. The method selects a group of instructions having pending input events by examining at least one word of the pending events table and executes the selected group of instructions to produce outputs to serve as inputs for destination instructions in other groups. The method updates the pending events table by clearing bits in the pending events table that correspond to inputs of the selected group and setting bits in the pending events table that correspond to inputs of destination instructions.

Some embodiments of the disclosure provide a method for simulating a design. The method receives a specification of a digital circuit. The specification includes a plurality of instructions for modeling behaviors of the digital circuit. Each instruction specifying an operation and a set of fan-out destinations. The method stores each instruction at a different memory location in an instruction memory. The method executes the plurality of instructions by (i) generating an instruction address, (ii) using the generated instruction address to fetch the instruction from the instruction memory and to fetch the instruction's inputs from a data memory, (iii) performing the operation specified by the fetched instruction based on the fetched input data and producing an output, and (iv) storing the output in a set of memory locations of the data memory according to the set of fan-out destinations specified by the instruction.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIGS. 13a-b conceptually illustrate the content of the event time wheel storage, the event table, and the data memory in different time steps.

DETAILED DESCRIPTION

Figure 1A:
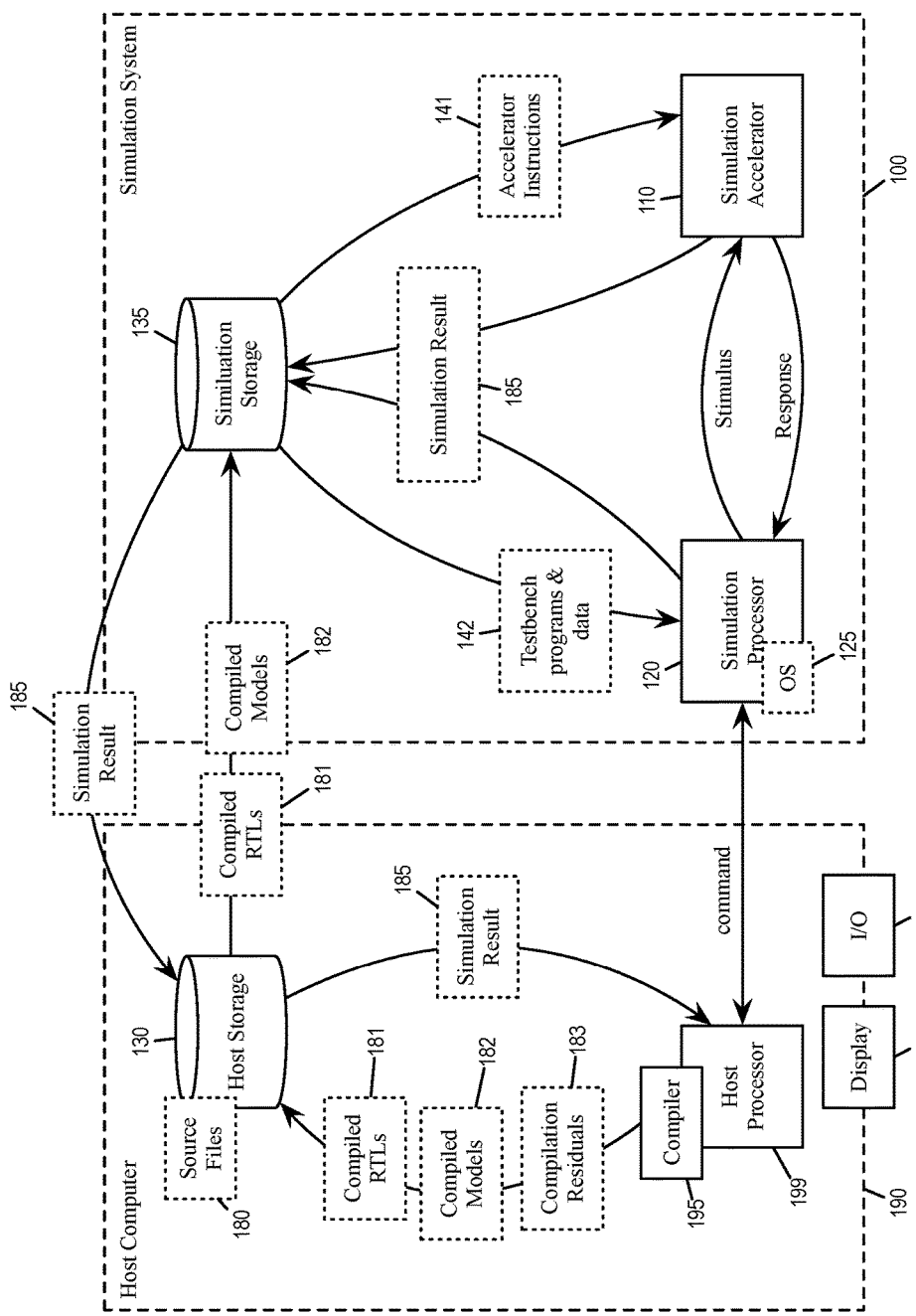
FIG. 1a illustrates a simulation system according to some embodiments of the disclosure.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

Software implementations of design simulators are traditionally relied upon as the most flexible solution for simulating hardware and performing design verification. Simulators compliant with IEEE 1800-2012 support arbitrary mixtures of legacy C/C++, Verilog, and SystemVerilog using methodologies ranging from the industry-standard Universal Verification Methodology (UVM) to unstructured ad hoc approaches. As software platforms, these products absorb productivity-enhancing software engineering abstractions—object-oriented programming, re-entrant code, garbage collection, namespaces, etc.—and integrate them into the verification community.

The effective capacity of software simulators expands along with advancing computer speeds and memory resources. As the growth of central processing unit (CPU) speeds began to plateau in recent years, parallel processing based on multiple cores with multi-threaded execution are touted as the key to increased computing throughput. However, software-based simulators running on CPUs have been unable to realize the promises of parallel computing due to fundamental mismatches between the underlying hardware architecture and the specific demands of the task. A key impediment to realizing the promises of parallel computing is memory access latency. Experimental results show that Verilog simulations use fewer than 5% of the cycles for actual execution while spending overwhelming majority of the remaining cycles waiting for memory access through layers of CPU cache.

An alternative to software design simulators is hardware emulator. Under hardware emulation, synthesized register transfer level (RTL) descriptions of digital circuits is mapped directly to FPGA logic blocks or specialized processors. The result is a cycle-accurate version of the target design running in hardware at speeds considerably greater than software simulation. Every active block or processor is assigned a specific set of synthesized gates to compute during each clock cycle. In other words, hardware emulation simulates the design by completely implementing the design, albeit with relaxed timing requirements.

As a result of this hardware assignment, the computational efforts to compile and map RTL onto emulator fabrics are significant. Furthermore, expanding the scope of an emulated design can become non-trivial, possibly triggering repartitioning or requiring physical expansion of the emulator substrate with more FPGAs or more processors. This negatively impacts the efficiency of the compile-run-modify design iteration cycle. Furthermore, like the target system, its emulated counterpart employs only two-state logic while software simulators benefit from the enhanced diagnostic capabilities granted by four-state (or more) logic. The loss of abstraction suffered in moving from flexible software to fixed hardware impacts debugging in other ways as well.

I. Simulation System

Some embodiments of the disclosure provide an improved simulation system. The simulation system has a simulation accelerator that accelerates RTL simulations by hiding memory latency and exploiting available parallelism in the RTLs. The simulation system also has a dedicated simulation processor for executing testbench codes. This allows the testbench codes to more efficiently interact with the RTLs than relying on a general-purpose host computer to execute testbench codes.

FIG. 1a illustrates a simulation system 100 according to some embodiments of the disclosure. The simulation system 100 uses parallel processing to accelerate the simulation of a design while minimizing memory access latency. The simulation system 100 receives user communications through a host computer 190. The simulation system 100 also receives compiled design data 181-182 from a compiler 195 running on a host computer 190.

The host computer 190 is a computing device that the user interfaces when using the simulation system 100. The host computer 190 includes a host processor 199, a host storage 130, a set of input/output devices (I/O) 191 and display 192. It is a general-purpose computer that includes an operating system and provides a user interface through its I/O 191 and its display device 192. The host processor 199 is also a CPU that operates several layers of caching structure.

The host computer 190 receives commands from the user and directs the simulation system 100 to perform operations based on the received user commands, including initiating and/or terminating simulation. It also collects simulation results from the simulation system 100 and presents the result data to the user. In some embodiments, the host computer 190 is running a simulation viewing application at a graphical user interface (GUI) for presenting the collected simulation to the user. In some embodiments, the host computer 190 and the simulation system 100 are not physically in a same device, so they communicate through an inter-device communications medium such as Universal Serial Bus (USB), Ethernet cable, Bluetooth connections, wired or wireless networks, PCI or PCI-Express, etc. These inter-device communications mediums are often shared by multiple data sources and are typically of lower bandwidth and higher latency than intra-device data transport mediums. To avoid slowing down the accelerated simulation operations of the simulation system 100, the host computer 190 in some embodiments does not participate in real-time simulation operations of the simulation system 100. Its interaction with the simulation system 100 is limited to non-real-time control operations such as configuration, reset, simulation start, simulation termination, interrupts, retrieving simulation result, and other latency-tolerant operations.

The compiler 195 is a program that compiles the source files 180 into compiled design files 181-183 by translating or converting the content of the source file into data structures in formats that can be understood by the simulation processor 120 and/or the simulation accelerator 110. As illustrated, the compiled design files 181-183 includes files for compiled RTLs 181, compiled models 182, and compilation residual items 183. The compiled RTLs 181 and the compiled models 182 are in a format that can be understood and operated upon by the simulation system 100, while the compilation residual items 183 are to be handled by the host computer 190. In digital circuit design, RTL is a design abstraction which models a synchronous digital circuit in terms of the flow of digital signals (data) between hardware registers, and the logical operations performed on those signals.

As illustrated, the host computer 190 operates the compiler program 195. In some embodiments, another computing device (not illustrated) operating the compiler program 195 compiles the source files 180 into the compiled design files 181-183. The compiler 195 converts RTL codes into compiled RTLs 181 that includes instructions for the simulation accelerator 110. The compiler 195 also divides the instructions for the simulation accelerator 110 into groups in order to facilitate parallel processing at the accelerator. The compiler 195 compiles models 172 into compiled models 182. The compiled models 182 may include codes that are executable by the simulation processor 120 as well as instructions that are executable by the simulation accelerator 110. The operations of the compiler will be further described by reference to FIG. 7 below.

The host storage 130 is the main storage of the host computing system 190. The host storage 130 stores the source files 180 for the compiler 195 to access. The compiled result, namely the compiled design data 181-183 are stored in the host storage 130. Among these, the compiled RTLs 181 and the compiled models 182 are transported to the simulation system 100 and stored in the simulation storage 135 prior to the start of the simulation. The compilation residual 183 are data structures in the testbench that cannot be handled efficiently by the simulation system 100 so they remain in the host storage 130 to be processed by the host processor 199.

The simulation system 100 is an electronic device that includes both a simulation accelerator 110 and a simulation processor 120. In some embodiments, the simulation system 100 also includes a simulation storage 135 for storing data used by the simulation accelerator 110 and the simulation processor 120. In some embodiments, the simulation accelerator 110 and the simulation processor 120 are implemented in different ICs. In some embodiments, the simulation system 100 is implemented by an IC that includes both the simulation accelerator 110 and the simulation processor 120. The IC can be a field programmable gate array (FPGAs) or an Application Specific Integrated Circuit (ASIC). In some embodiments, the simulation processor 120 is an embedded processor in an FPGA (e.g., an ARM processor) while the simulation accelerator 110 is implemented by the FPGA's programmable resources. The simulation processor 120 and the simulation accelerator 110 are communicatively coupled by intra-device communications medium such as dedicated conductors or signal pathways. During design simulation, the simulation processor 120 and the simulation accelerator 110 exchange real-time data over the intra-device communications medium with little latency.

The simulation accelerator 110 is for simulating RTLs. It accelerates the simulation of the RTLs by performing parallel processing on the compiled RTLs 181. Simulation accelerator 110 will be further described by reference to Sections II and III below.

The simulation processor 120 is a processor or CPU dedicated to executing non-synthesizable testbench codes during design simulation (through some non-synthesizable testbench codes are compiled into instructions and executed by the simulation accelerator 110). The simulation processor 120 generates stimulus to the simulation accelerator 110 for testing the RTLs. The simulation processor 120 also receives responses from the accelerator 110 in real-time, which allows the simulation processor 120 to generate follow-up stimulus to the simulation accelerator 110. The simulation processor 120 is also executing an operating system 125, which supports file management operations by the simulation system 100. Having its own operating system 125 at the simulation processor 120 enables the simulation system 100 to transport (or retrieve) files and data (such as the compiled design data 181 and 182) directly from the host storage 130 into the simulation storage 135. The simulation system 100 therefore does not rely on the host computer 190 for file access, thereby avoiding operational latencies associated with data transport with the host computer system 190.

The simulation storage 135 is on the same electronic device (or a same IC) as the simulation processor 120 and the simulation accelerator 110 so that the simulation processor 120 and the accelerator 110 can access the simulation storage 135 via fast intra-device communications medium. During design simulation, the simulation storage 135 provides the compiled models 182 and the compiled RTLs 181 to the simulation accelerator 110 and the simulation processor 120, which are in the form of instructions 141 for the simulation accelerator and testbench programs/data 142 for the simulation processor 120. The simulation storage 100 also stores simulation result 185 produced by the simulation accelerator 110 and by the simulation processor 120. The stored simulation result 185 can be transported to the host computer 190 later. The use of the simulation storage 135 therefore minimizes the impact of host system latency, because the simulation processor 120 and the simulation accelerator 110 can access the simulation storage 135 rather than the host system storage 130 during simulation.

Figure 1B:
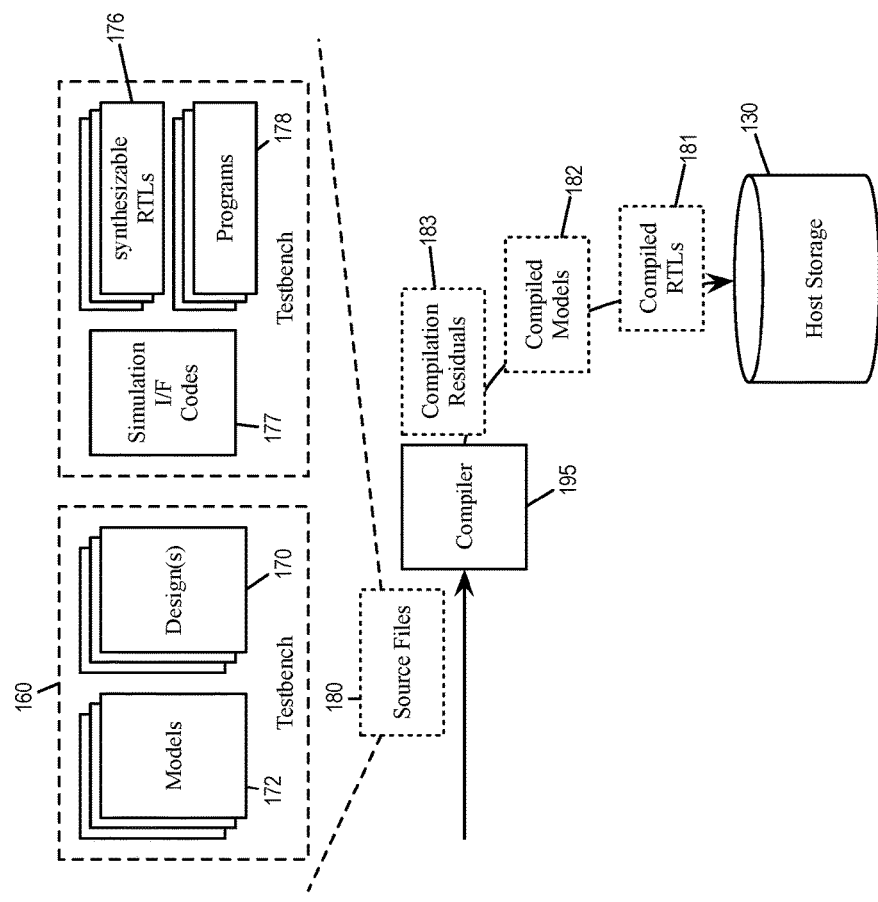
FIG. 1b illustrates the generation of the compiled design data based on a testbench.

FIG. 1b illustrates the generation of the compiled design data 181-183 based on a testbench 160. A testbench is a virtual environment used to verify the correctness of a design or model of a digital circuit or a set of digital circuits. The testbench 160 specifies a virtual environment for testing a design 170 of digital circuits. The testbench 160 can be viewed as including the design 170 and models 172. The design 170 includes descriptions of behaviors and/or structures of a digital circuit or of a set of digital circuits being engineered. The models 172 are models of the testing environment that provide stimulus to the design 170. The testbench 160 can also be viewed as including synthesizable codes 176 and programs 178. The synthesizable codes 176 (also referred to as RTLs) are codes that can be synthesized into digital circuit elements such as gates and/or transistors. The programs 178 are codes that cannot be translated into digital circuit elements, but can nevertheless be executed to perform operations within the testbench 160. In some embodiments, the testbench 160 may also include simulation interface codes 177 such as VPI or PLI commands.

The design 170 is written in synthesizable codes that describe the structures and/or behaviors of the design. For digital circuits, such synthesizable codes are RTLs written in Verilog, VHDL, or other types of hardware description language. The design 170 is also referred to as the device under test (DUT), since the testbench is set up to simulate and test the design 170. The RTLs that describe the design 170 are therefore referred to as the DUT RTLs.

The models 172 are not part of the design and can be written in codes that cannot be synthesized into digital circuits. These models can be written in Verilog, VHDL, System Verilog, but can also be written in common computer programming languages such as C++.

The testbench 160 describes the testing platform for the design 170. It may include both synthesizable code and non-synthesizable code written in hardware description languages such as Verilog, VHDL, and System Verilog. In some embodiments, the testbench is written in language capable of supporting data exchange between programs (such as models written in C++) and synthesizable codes (such as RTLs written in Verilog).

As illustrated, the testbench 160 (including the design 170 and the models 172) is stored as a set of source files 180. The compiler 195 compiles the source files 180 into the compiled design data 181-183. The compiled design data 181-183 are stored in the host storage 130, while the compiled design data 181-182 are also transported to the simulation storage 135. The compiled design files 181-183 include files for the compiled RTLs 181, the compiled models 182, and the compilation residuals 183.

The compiled RTLs 181 is a set of processed data structures that are derived from the synthesizable codes 176. The synthesizable codes of the testbench 160 (including the design 170) includes computational elements and timing elements. Computational elements are units at which computations take place. Timing elements are units at which signals, data, and result of computations are held for over a period of time. In a synthesized digital circuit, timing elements correspond to delays, memories, registers, latches, or clocks, while computational elements correspond to Boolean gates, arithmetic units, or other types of combinational logic elements.

In the compiled RTLs 181, the computational elements are implemented as instructions executable by the simulation accelerator 110 (i.e., as accelerator instructions 141). These instructions of the compiled RTLs emulate or model the behaviors and/or structures of the design 170. These accelerator instructions perform computation operations such as Boolean computations (logic gates such as NAND, NOR, XOR, MUX, etc.), bitwise computations (shift, mask, etc.), arithmetic computations (add, subtract, multiply, divide, etc.), and other types of computation operations that can be performed by the simulation accelerator 110.

The compiled models 182 are executable programs compiled from non-synthesizable codes 178 (such as those written in C++ and some non-synthesizable Verilog syntax). These programs are executable by the simulation processor 120 and the operating system 125 and delivered to the simulation processor 120 as the testbench programs/data 142. Some of the compiled models are implemented as instructions that are executable at the simulation accelerator 110 (i.e., as accelerator instructions 141). These instructions include program flow constructs (such as for-loop, while-loop, branch, and initial block, etc.), data storage operations (such as load, move, copy, delete, etc.), and other types of instructions that can be performed by the simulation accelerator 110.

The compilation residuals 183 are data specified in the testbench 160 that cannot be processed by the simulation accelerator 110 or the simulation processor 120. For example, the testbench 160 may include elements that invoke resources that are not available in the simulation processor 120 or the simulation accelerator 110, such as display related commands or user interface related commands. These commands are part of the residual 183 handled by the host computer 190, which has display resource 192 and user interface resources 191. In some embodiments, some simulation interface codes written in VPI or PLI are also handled by the host computer 190 as part of the compilation residual 183.

Based on the compiled RTLs 181, the compiled models 182, and the residual 183, the simulation system 100 conducts the testing of the design 170 by simulation in coordination with the host computer 190. Specifically, the simulation accelerator 110 performs simulation of the design 170 by executing the accelerator instructions 141 (from the compiled RTLs 181 and/or from the compiled models 182), while the simulation processor 120 uses testbench program/data 142 (from the compiled models 182) to provide stimulus to the simulation accelerator 110 and to capture responses from the simulation accelerator 110.

The simulation processor 120 uses the captured responses to produce further stimulus for the simulation accelerator 110, and/or to generate data that serve as part of the simulation results 185. The simulation result 185 also includes instrumentation data about the design 170 collected from the simulation accelerator 110. The simulation result 185 is stored in the simulation storage 135, and the host computer 190 retrieves the simulation result 185 and presents them to the user (e.g., as part of a design verification program.) The host computer may also perform certain simulation tasks that cannot be performed by the simulation accelerator 110 and the simulation processor 120.

II. Event Driven Simulation

In some embodiments, the simulation accelerator performs event driven simulation when executing instructions compiled from RTLs and testbench models. Event driven simulation is a simulation technique that models the operations of a system as a discrete sequence of events in time. Each event occurs at a particular instant in time and marks a change of state in the system. Between consecutive events, no change in the system is assumed to occur. Thus, the simulation can directly jump in time from one event to the next.

Figure 2:
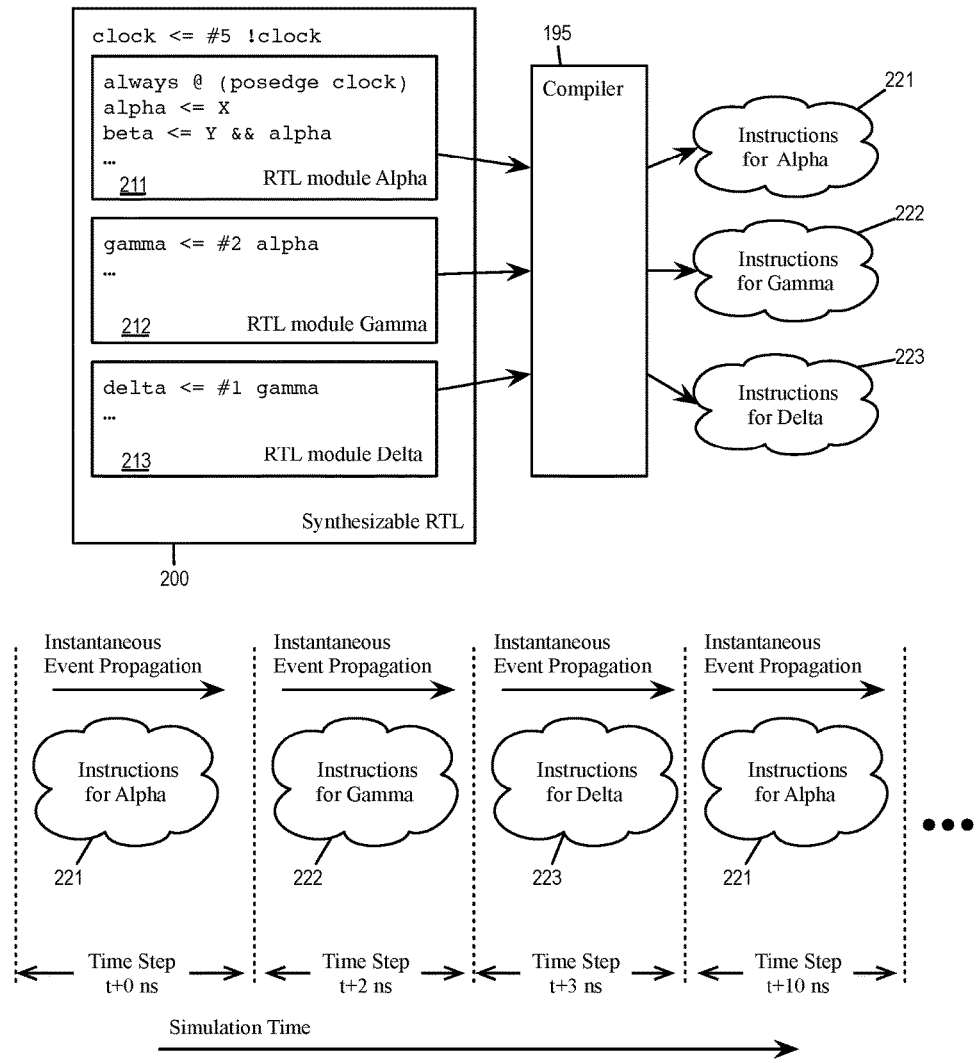
FIG. 2 conceptually illustrates event driven simulation of a RTL.

FIG. 2 conceptually illustrates event driven simulation of a RTL 200. The RTL includes different RTL modules (Alpha, Gamma, and Delta). Each RTL module includes a set of computational elements that are temporally separated from other computational elements. Specifically, the RTL module Alpha includes a set of computational elements 211, the RTL module Gamma includes a set of computational elements 212, and the RTL module Delta includes a set of computational elements 213. Each set of computational elements 211-213 performs computation at its corresponding specified simulation time instants, also referred to as time steps. In the example illustrated, the set of computational elements 211 computes whenever the signal "clock" is at a positive edge, the set of computational elements 212 computes 2 nanoseconds after whenever the signal "alpha" changes value, and the set of computational elements 213 computes 1 nanosecond after whenever the signal gamma changes. (Nanosecond is chosen as the simulation time unit for this example for illustration purposes.)

Computational elements that are separated from other computational elements by timing elements are collectively referred to as a combinational cloud. In an event driven simulation system, an event (e.g., signal change) propagates through the computational elements of a combinational cloud in the same time instant. The sets of computational elements 211-213 can therefore be referred to as combinational clouds 211-213, respectively. Each combinational cloud is compiled into a set of instructions for the accelerator 110.

To simulate the RTL 200 in the simulation system 100, the compiler 195 converts the RTL into sets of computation instructions 221-223 for the simulation accelerator 110. The computation instructions include instructions set 221 performing the operations of the combinational cloud 211, instructions set 222 performing the operations of the combinational cloud 212, and instructions set 223 performing the operations of the combinational cloud 213.

The simulation accelerator 110 is an event driven simulator. When simulation time reaches a particular time step, the accelerator 110 executes the instructions that have pending events for that particular time step. In this example, the simulation accelerator 110 executes the instructions in the set 221 when the simulation time reaches the time step t+0 ns, the instructions in the set 222 when the simulation time reaches the time step t+2 ns, the instructions in the set 223 when the simulation time reaches the time step t+3 ns, the instructions in the set 221 when the simulation time reaches the time step t+10 ns, so on and so forth. The accelerator 110 executes the instructions of each time step as if events propagate through the computational elements of the time step without elapsing any simulation time. It can also be said that, at each time step, the accelerator 110 executes all instructions having pending events scheduled for that time step.

A set of instructions that are scheduled to always execute at the same simulation time step(s) is referred to as an instruction cloud. The sets of instructions 221-223 can therefore be referred to as instruction clouds 221-223, respectively. An instruction cloud can include instructions from the compiled RTLs 181 that perform the operations of the computation elements in a combinational cloud (such as combinational clouds 211-213). An instruction cloud can also include instructions from the compiled models 182 that perform the operations of the non-synthesizable testbench components.

Figure 3A:
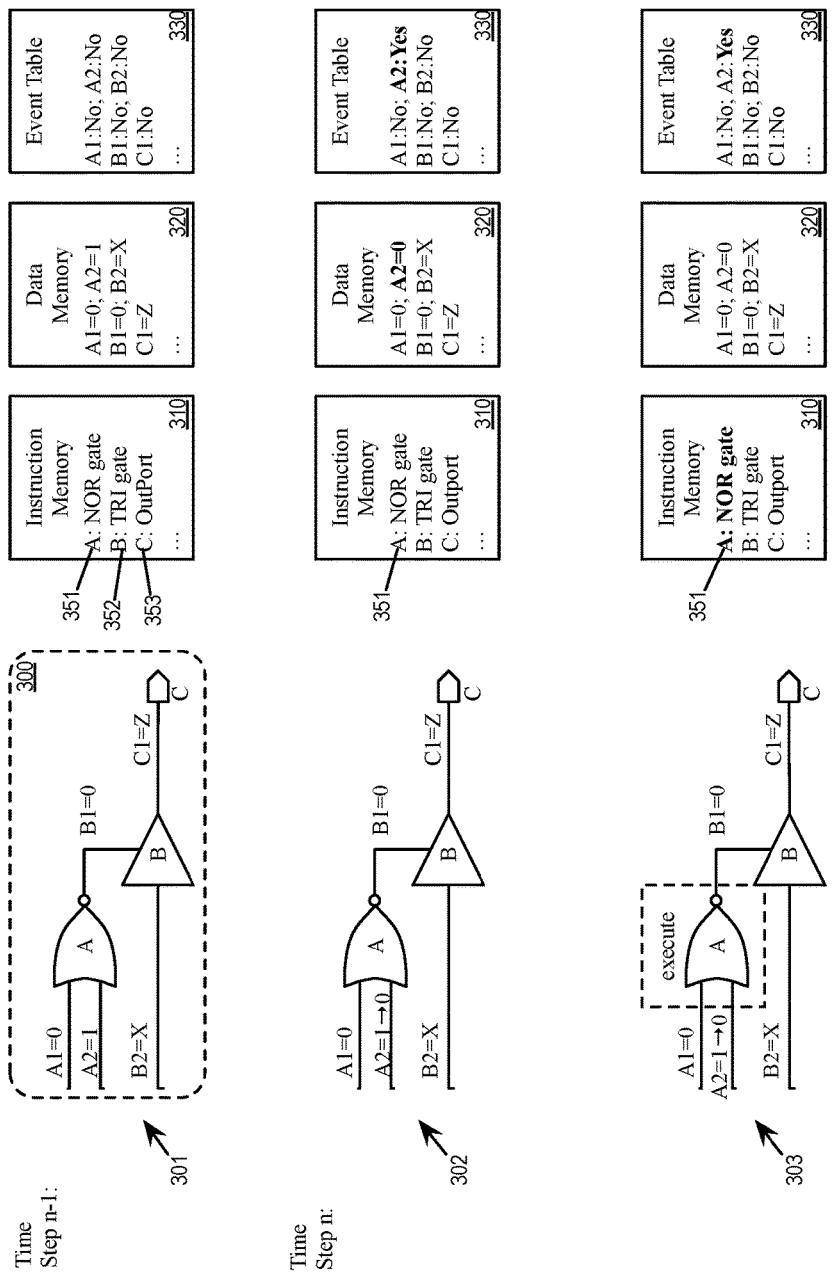
FIGS. 3a-b illustrates the execution of instructions by the simulation accelerator when simulating RTLs.
Figure 3B:
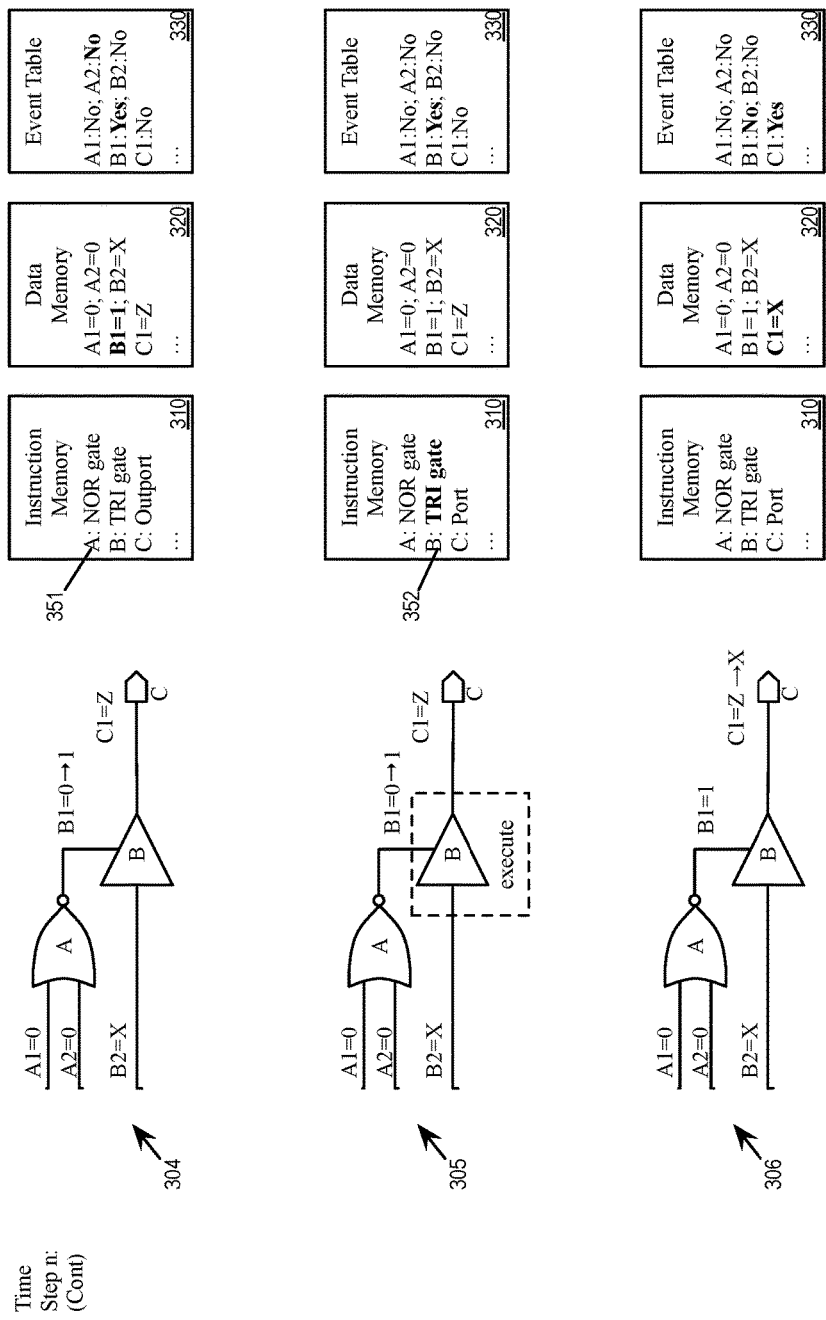

FIGS. 3a-b illustrates the execution of instructions by the simulation accelerator when simulating RTLs. The figures show the simulation of an example design of a digital circuit 300, which includes a NOR gate "A", a tri-state buffer "B", and an output port "C". The NOR gate "A" has two inputs "A1" and "A2". The tri-state buffer "B" has two inputs "B1" and "B2". The input "B1" is connected to the output of the NOR gate "A". The input "B1" is the tri-state control of the tri-state buffer "B". When the input B1 is high, the input "B2" is allowed to reach the output port "C". When the input B1 is low, the tri-state buffer "B" is tri-stated and the port "C" is also tri-stated.

The accelerator 110 uses several data structures when performing simulation. These data structures include an instruction memory 310, a data memory 320, and an event table 330. The compiler 195 compiles the RTL of the circuit 300 into instructions that can be executed by the accelerator 110, and the accelerator 110 stores the instructions in the instruction memory 310. Each instruction has a corresponding set of input data (i.e., the signal value currently sitting at the input of the instruction), and the accelerator stores the input data of each instruction at a corresponding location in the data memory 320 for each instruction. The accelerator 110 would execute an instruction only when at least one of the instruction's input data has changed (i.e., there is a pending event at an input of the instruction, or a pending input event). The accelerator uses the event table 330 to keep track of which instructions have pending input events and to identify which instructions need to be executed.

FIGS. 3a-b illustrate the accelerator performing the simulation of the digital circuit 300 by using the instruction memory 310, the data memory 320, and the event table 330 in six stages 301-306. The accelerator 110 has already loaded the instruction memory with the compiled instructions that corresponds to the components of the digital circuit 300, including an instruction 351 for performing the operations of the NOR gate "A", an instruction 352 for performing the operations of the tri-state buffer "B", and an instruction 353 for performing the operations of the output port "C".

At the first stage 301, the simulation is at time step n−1. According to the content of the data memory 320, the inputs "A1" and "A2" of the instruction 351 are respectively at '0' and '1', the inputs B1 and B2 of the instruction 352 are respectively at '0' and 'X' (unknown), and the input "C1" of the instruction 353 is at Z (tri-stated). According to the event table 330, there is no pending event at any of the inputs to the instructions 351-353. This reflect the fact that the output of the NOR gate "A" and the output of the tri-state buffer "B" are both up-to-date with respect to their inputs, and there is no need to execute the instructions 351-353.

It is worth noting that, the simulation accelerator 110 is based on computation of instructions where the propagation of signals is expressed as values stored in memories. It is therefore capable of expressing signal values using 4-state logic, i.e., '1', '0', 'X', and 'Z'. This is unlike hardware emulators, where the signals can only be either '1' or '0' because they are carried by actual physical wires. Furthermore, in some embodiments, instructions can handle inputs and outputs that are of complex data types, not merely bit values.

At the second stage 302, the simulation has progressed to time step n. According to the event table 330, there is a pending event at the A2 input of the instruction 351 (NOR gate "A"). According to the data memory 310, the value at the A2 input has changed from '1' to '0'. The simulation accelerator 110 has not executed the instruction 351, the output of the NOR gate therefore remain the same as before (still at '0'), which is out of date.

At the third stage 303, the simulation is still at time step n. However, based on the content of the event table 330, the accelerator 110 selects the instruction 351 for execution because it has pending input event at its input A2.

At the fourth stage 304, the simulation remains at time step n. The execution of the instruction 351 has produced a new output value '1', which causes the input data of B1 of the instruction 352 (tri-state buffer "B") to change from '0' to '1' in the data memory 320. At the event table 330, the execution of the instruction 351 clears the pending input event at A2 and set a new pending input event at the B1. The output of the tri-state buffer "B" however remains at 'Z', which is out of date.

At the fifth stage 305, the simulation remains at time step n. Based on the content of the event table 330, the accelerator 110 selects the instruction 352 (tri-state buffer "B") for execution because it has pending input event at its input B1.

At the sixth stage 306, the simulation remains at time step n. The execution of the instruction 352 has caused the tri-state buffer "B" to open, which allows the input data at B2 to reach the output of the buffer and change the output of the tri-state buffer. Since the B2 input is 'X' (unknown), the output of the tri-state buffer "B" also becomes 'X'. The output of the tri-state buffer "B" fan-out to the output port "C", changing the value of the input C1 to 'X'. At the event table 330, the execution of the instruction 352 clears the pending input event at B1 and set a new pending event at the C1.

III. Simulation Accelerator

A. Architecture

As mentioned, the simulation system 100 includes a simulation accelerator 110 that uses parallel processing to accelerate the simulation of RTLs while minimizing memory access latency. In some embodiments, the accelerator has an array of parallel computing resources. The simulation accelerator receives a processed (i.e., compiled) version of the design in which the components of the design are mapped to instructions for the parallel computing resources. The instructions in the processed version of the design are divided into groups, in which instructions belonging to a same group are logically independent of each other. The simulation accelerator fetches instructions and data for processing by the parallel computing resources for one group of instructions at a time. Since all instructions thusly fetched are logically independent of each other, the parallel computing resources are free to execute the instructions of a group in parallel and/or in any arbitrary order. In addition, since no instruction has to wait for the completion of another instruction before being fetched or executed, the simulation accelerator can retrieve a block of instructions in a burst or streaming manner. This minimizes the effect of memory access latency during RTL simulation.

Figure 4:
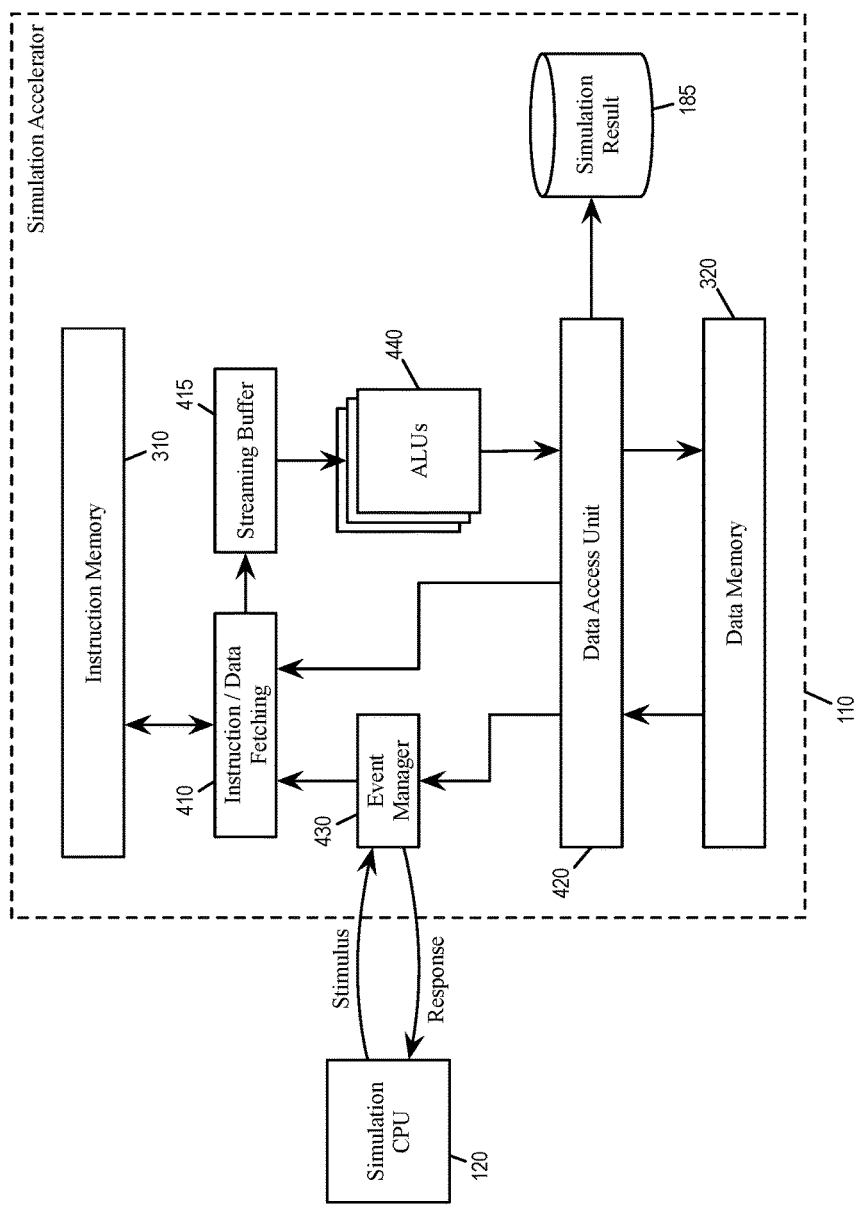
FIG. 4 illustrates a block diagram of the simulation accelerator for some embodiments.

FIG. 4 illustrates a block diagram of the simulation accelerator 110 for some embodiments. As illustrated, the accelerator includes the instruction memory 310, the data memory 320, along with an instruction data fetching unit 410, a streaming buffer 415, a data access unit 420, an event manager 430, and an array of arithmetic logic units (ALUs) 440. In some embodiments in which the simulation accelerator is implemented as digital hardware such as an integrated circuit (IC), these various blocks or modules are implemented by sets of digital circuits. In some embodiments in which the simulation accelerator 110 is implemented as software or firmware being executed by one or more processing units (e.g., processors), these various blocks or modules are implemented as software modules or sets of instructions.

The compiled instructions are stored at the instruction memory 310 and the inputs to the instructions are stored in the data memory 320. The Instruction/Data fetching unit 410 fetches the instructions and their corresponding input data from those memory structures and stores the fetched instruction and data in the streaming buffer 415. The streaming buffer 415 is a buffer between the fetching of instructions from the instruction memory and the execution of the instructions by the array of ALUs 440. Each ALU in the array 440 is an arithmetic and/or logical processing units that executes instructions based on the input data to produce output data. Each instruction stored in the streaming buffer is received and executed by only one ALU, and each ALU executes each received instruction independently of other ALUs. The data access unit 420 receives the output values computed by the ALUs 440 and stores them in the data memory 320 to serve as input data for other instructions. The data access unit 420 also stores the computed output values as simulation result 185 (to be stored in the simulation storage 135 and reported to the host computer 190).

The event manager 430 maintains the event table 330. It reports the content of the event table 330 to the instruction/data fetching unit 410 so it is able to identify instructions having pending input event and decides which instruction to fetch. It also updates the content of the event table 330 by observing, from the data access unit 420, which instructions are being executed and which inputs of which instructions are being updated as the result. The event manager 430 also maintains an event time wheel storage (or event wheel) that stores pending input events for future time steps. The event manager, the event table, and the event time wheel storage will be further descried below in Section III.C.

Figure 5:
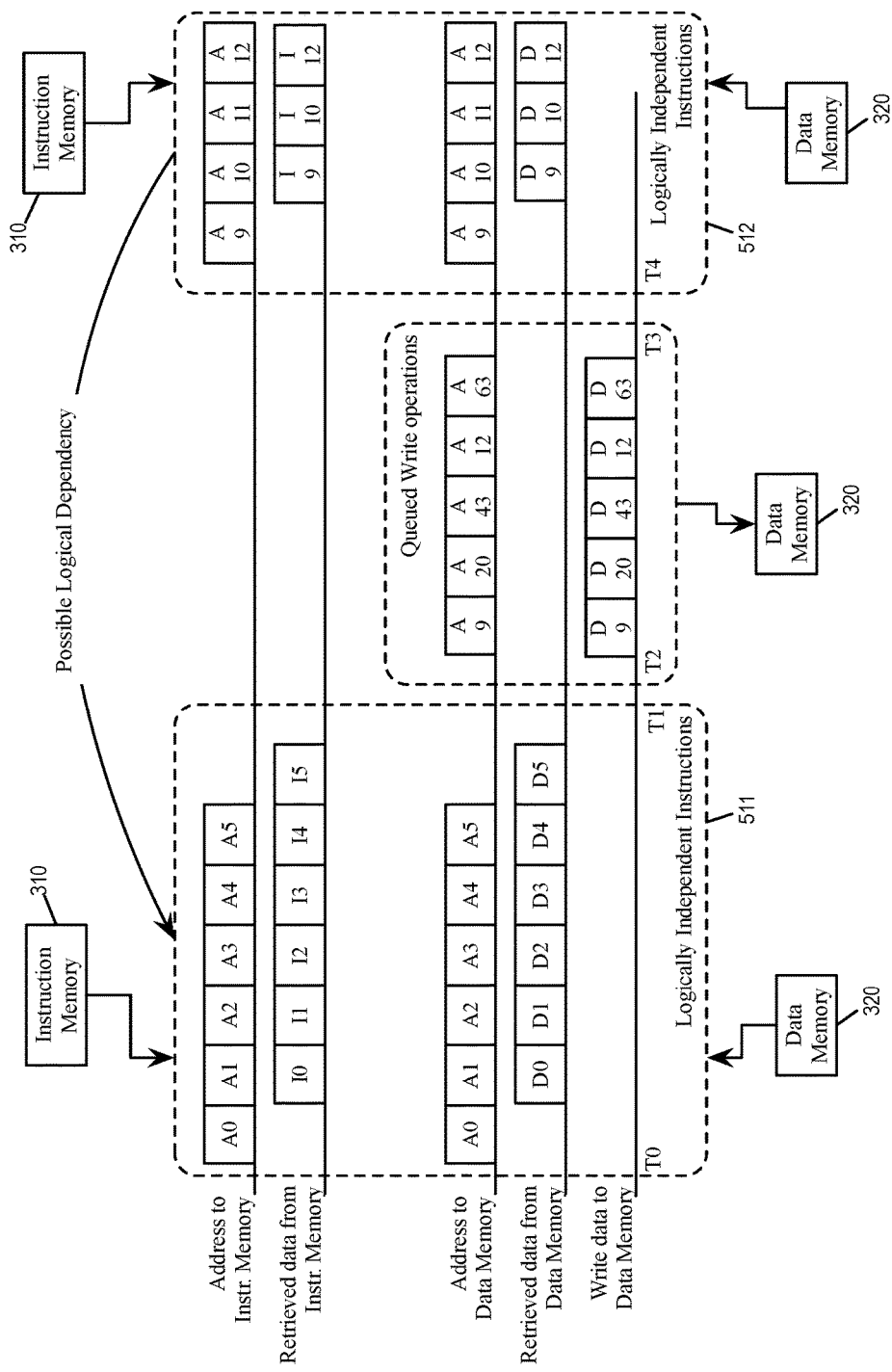
FIG. 5 illustrates the fetching of instruction and data in the simulation accelerator.

As mentioned, the received instructions are organized into groups, where instructions in a same group are logically independent of each other. The instruction/data fetching unit 410 retrieves instructions from one group at a time, and the ALUs receives and executes instructions from the same group before receiving and executing instructions from the next group. FIG. 5 illustrates the fetching of instruction and data in the simulation accelerator 110.

The figure illustrates a time line at the instruction memory 310 and at the data memory 320. Between time T0 and T1, the instruction/data fetching unit 410 is fetching instructions and data for an instruction group 511. The group 511 includes instructions I0 through I5 (with corresponding input data D0 through D5). Since I0 through I5 are instructions that are logically independent of each other, the instruction/data fetching unit 410 would never have to wait for one instruction to complete before deciding which instruction to fetch next. Consequently, the instructions of the group 511 can be retrieved in a burst fashion, thereby minimizing memory access latency.

Between the time T2 and T3, the data access unit 410 is writing the output data of the instructions in the group 511 (instructions I0-I5) to the data memory 320. The output data are written into the data memory 320 to serve as input data for other instructions. Since the instructions in the group 511 are logically independent of each other, their output data is always for instructions of other groups and can never possibly become input data of the instructions in the group 511. The write operation of an output data may therefore occur as soon as the instruction that produces the output data is executed (i.e., T2 may occur before T1). The write operation of the output data may also be delayed (i.e., queued) until there is an opportunity to write the output data into the data memory 320. The logical independence of instructions within a same group facilitates timing flexibility in the write operations, which further reduces memory access latency.

After time T4 (and after the ALUs finish executing the instructions in the group 511), the instruction/data fetching unit 410 fetches instructions and data for another instruction group 512. The instructions in the group 512 are logically independent of each other, but they maybe logically dependent upon the instructions in the group 511. The execution of the group 512 therefore starts only after update to input data has completed. In some embodiments, the accelerator would not execute a group of instructions until all write operations to the data memory 320 have completed. Since the fetching of the instructions in the group 512 occur only after the ALUs in the array 440 have completed executing the instructions of the previous group 511, it is assured that the ALUs are receiving and executing instructions from the same group. The ALUs in the array 440 can therefore execute fetched instructions in parallel since the instructions being executed by the different ALUs are logically independent of each other.

The simulation accelerator 110 therefore accelerates the simulation of RTLs in several ways. By processing the compiled instructions as groups, the array of ALUs can fully function as parallel computing resources to accelerate the simulation of the DUT RTL. The logical independence of the instructions in each group also allows the simulation accelerator 110 to minimize memory access latency by burst mode. The memory access latency is further reduced in comparison to general-purpose computer (such as the host computer) because the fetching of the instructions and data does not go through layers of caching structure. In some embodiments, the ALUs not only perform instructions in parallel, they also supports an instruction set that is tailored toward RTL simulation. Such an instruction set in some embodiments includes instructions that match Verilog commands or constructs, which are not available in general purpose CPUs. A single instruction for the simulation accelerator can encompass a sequence of x86 instructions while also handling either two-state or four-state logic.

B. Group Sort

The simulation accelerator is able to execute the instructions of the compiled RTLs in parallel. This is because the instructions of the compiled RTLs are sorted into groups, each group having instructions that are logically independent of each other. More generally, the simulation receives instructions that are sorted into groups so that the simulation accelerator can execute the instructions in parallel. These instructions can come from the compiled RTLs and/or the compiled models.

Figure 6:
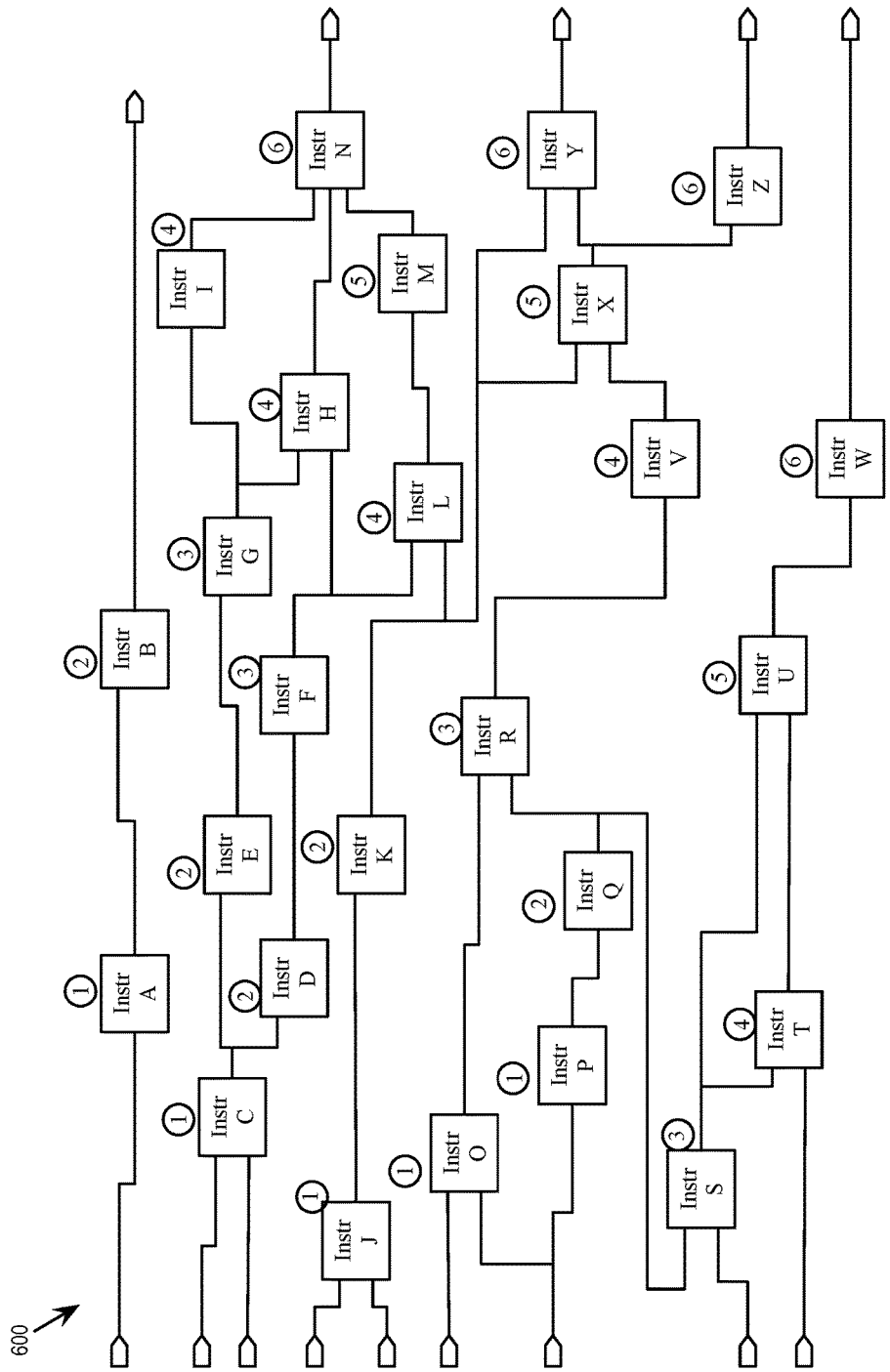
FIG. 6 conceptually the sorting of instruction in an instruction cloud into groups.

FIG. 6 conceptually illustrates the sorting of instructions in an instruction cloud into groups. The figure illustrates an instruction cloud 600. The instructions of the instruction cloud 600 are scheduled to execute at the same time step(s) during event driven simulations by the simulation accelerator 110. The instructions cloud 600 may include instructions that correspond to computational elements in a combination cloud of a compiled RTL. The instructions cloud 600 may also include instructions that correspond to non-synthesizable constructs of the testbench (i.e., from the compiled models of the testbench.)

As illustrated, the instruction cloud 600 includes 26 instructions, labeled A through Z. Each solid line connecting the output of a particular instruction to one or more inputs of other instructions represent the fan-out or propagation of output data from the particular instruction to the other instructions. For example, the output of the instruction Q is connected to inputs of instructions R and S, so the output of the instruction Q fans out to instructions R and S. A particular instruction is said to be logically dependent on another instruction if a change at the output of the other instruction affect an input of the particular instruction. For example, the instruction L receives inputs from the outputs of instructions F and K, so the instruction L is logically dependent on instructions F and K. Furthermore, since instruction F receives an input from the output of instruction D and instruction D receives an input from instruction C, instruction L is also logically dependent on instructions D and C. It is worth noting that two instructions are considered logically independent of each other as long as they do not affect each other's input during the same time step. Whether the output of one instruction affects the input of another instruction at a future time step is irrelevant to the determination of logical dependencies.

According to the logical dependencies of the instruction cloud 600, the compiler sorts the instructions of the instruction cloud 600 into six groups 1 through 6 (each instruction is labeled with its group number.) Group 1 includes instructions A, C, J, O, and P. Group 2 includes B, D, E, K, and Q. Group 3 includes F, G, R, and S. Group 4 includes H, I, L, T, and V. Group 5 includes instructions M, U, and X. Group 6 includes instructions N, W, Y, and Z. As illustrated, within each group, the instructions are logically independent of each other, i.e., no instruction depends on another instruction of the same group for its input (directly or indirectly). For example, the group 2 has five instructions B, D, E, K, and Q. These five instructions are logically independent of each other. A change at the output of instruction B would not affect the inputs of D, E, K, and Q, and a change at the output of instruction D would not affect the inputs of instructions B, E, K, and Q, so on and so forth. It is worth noting that each group of instructions may include both instructions implementing computational elements in RTLs and instructions implementing non-synthesizable testbench components.

In some embodiments, the compiler 195 performs group sort on instructions of an instruction cloud by (1) identifying instructions that depend only on input ports of the instruction cloud as the initial group, (2) identifying instructions that depend only on input ports or outputs of the first group as the second group, (3), identifying instructions that depend only on the input ports or the outputs of the first or second groups as the third group, and so on and so forth. In other words, the compiler (at the group-sort stage) identifies each successive group by identifying instructions that depend only on input ports of the instruction cloud or outputs of instructions already identified as belonging to previously identified group(s). In the example of FIG. 6, the group sort start from instructions A, C, J, O, P, as these are the instructions that depend on only the input ports of the instruction cloud 600, while other instructions have at least one input that depend on other instructions of the instruction cloud 600.

Figure 7:
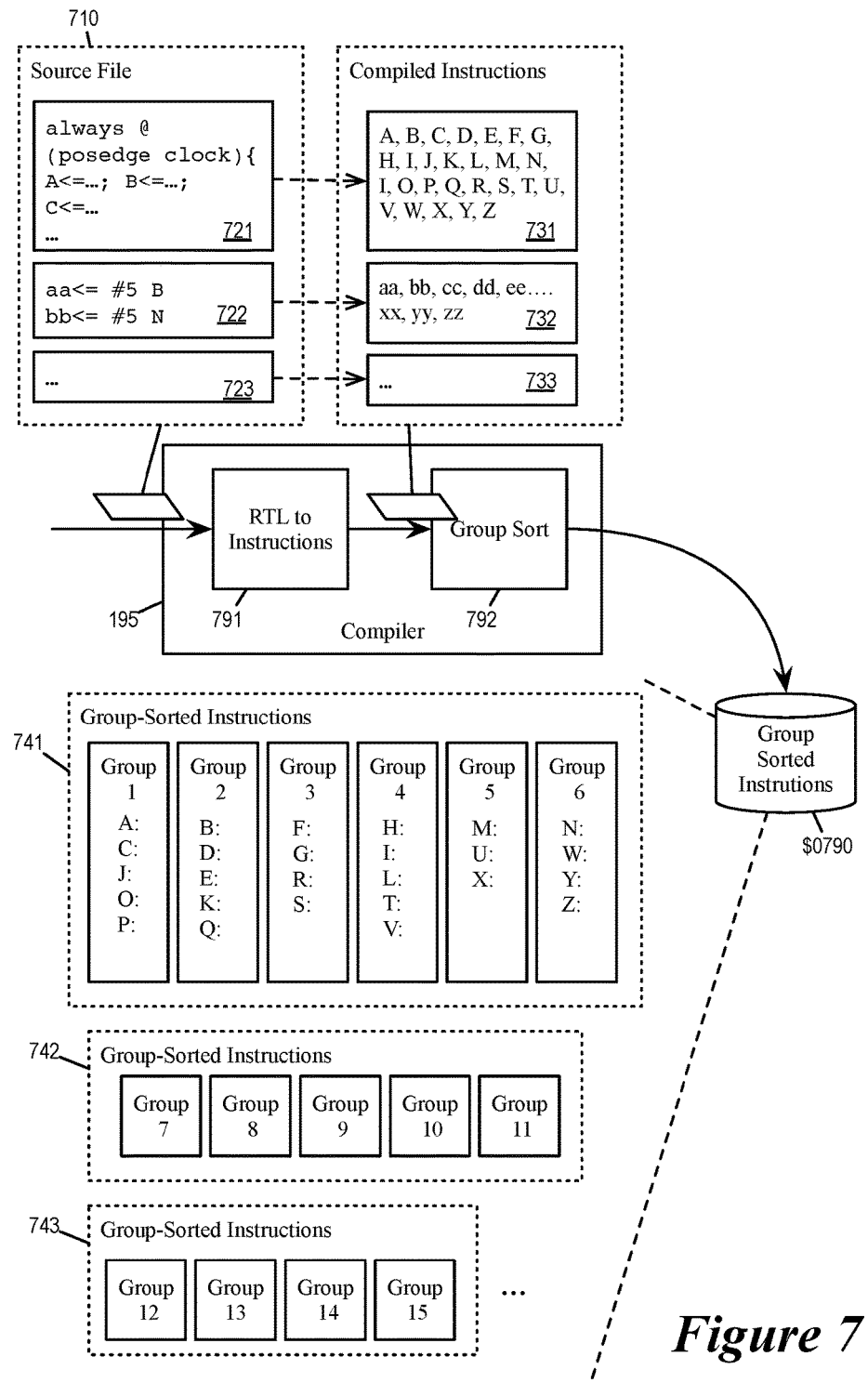
FIG. 7 conceptually illustrates the compiling of RTLs into sorted groups of instructions.

FIG. 7 conceptually illustrates the compiling of RTLs into sorted groups of instructions 790. The figure illustrates the compiler 195 compiling a source file 710 containing a testbench to be simulated. The source file 700 contains RTLs. The RTLs include different modules that may be active at different time steps, including RTL modules 721, 722, and 723. RTL modules 721, 722, and 723 correspond to different sets of computational elements (or combinational clouds) that are temporally separated by timing elements such as delays, memories, registers, latches, or clocks.

As illustrated, the compiler 195 includes two stages: an RTL-to-instructions stage 791 and a group sort stage 792. The RTL-to-instructions stage 791 is for compiling the RTLs from their original hardware description language coding (e.g., Verilog) into instructions that are executable by the simulation accelerator 110, with computational elements of combination clouds (and some testbench models) compiled into instructions of instruction clouds. In some embodiments, the RTL-to-instruction stage 791 performs Boolean optimization when converting RTL code into simulation accelerator instructions. The group sort stage 792 is for sorting the compiled instructions of each instruction cloud into groups, where instructions in each group are logically independent of each other as described above by reference to FIG. 6.

The RTL-to-instruction stage 791 compiles the RTL module 721 into a set of instructions 731, the RTL module 722 into a set of instructions 732, and the RTL module 723 into a set of instructions 733. The set of instructions 731 has the same instructions as the instruction cloud 600 of FIG. 6 (i.e., instructions A through Z). The group sort stage 792 performs group sort on the instruction sets 731, 732, and 733 separately as they belong to different instruction clouds that may be active in different time steps, i.e., instructions belonging to different instruction clouds are sorted into groups belonging to different instruction clouds. The instructions in the set 731 are sorted into groups of instructions 741 that include the groups 1, 2, 3, 4, 5, and 6 as illustrated in FIG. 6. The instructions in the set 732 are sorted into groups of instructions 742 that include groups 7, 8, 9, 10, and 11. The instructions in the set 732 are sorted into groups of instructions 743 that include groups 12, 13, 14, and 15. The sorted instructions 741, 742, and 743 are exported as the group-sorted instructions 790 of the source file 710.

Figure 8:
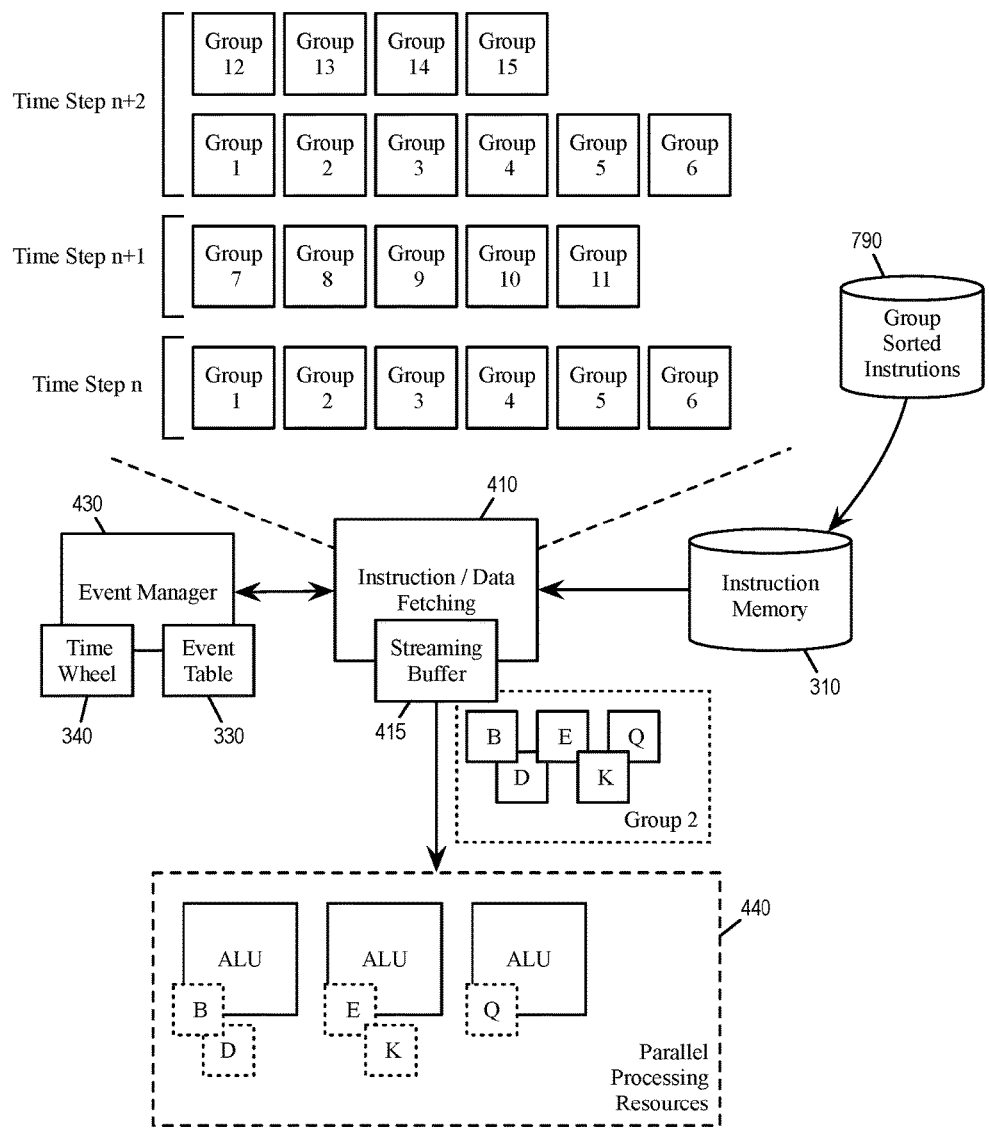
FIG. 8 conceptually illustrates simulation accelerator executing instructions that have been group-sorted.

FIG. 8 conceptually illustrates simulation accelerator executing instructions that have been group-sorted. Specifically, the figure illustrates how group-sorted instructions enables parallel processing when performing the RTL simulation at the simulation accelerator 110.

The figure illustrates the ALUs 440 of the simulation accelerator 110 receiving and executing instructions that have been group-sorted. The instruction fetching mechanism of the accelerator 110 (i.e., the instruction/data fetching unit 410 and the streaming buffer 415) retrieves data from the instruction memory 310, which stores the group-sorted instructions 790 produced by the compiler 195. For each time step, the instruction/data fetching unit fetches the groups that have pending events in that time step for execution. As illustrated, for the time step n, the instruction/data fetching unit 410 fetches groups 1 through 6 because they have pending events at time step n. For the time step n+1, the instruction/data fetching unit 410 fetches groups 7 through 11 because they have pending events at time step n+1. For time step n+2, the instruction/data fetching unit 410 fetches groups 1-6 as well as groups 12-15. Groups 12-15 belong to a different instruction cloud as groups 1-6, but they all have pending events at time step n+2.

The ALUs 440 executes the fetched instructions group by group. As an example, the figure illustrates the ALUs 440 executing instructions of group 2 of the instruction cloud 600. Group 2 includes five instructions B, D, E, K, and Q. Since these instructions belong to the same group and are logically independent of each other, they can be executed in any order by any of the ALUs 440. The ALUs execute the instructions in parallel, and each of the ALUs in the array 440 executes a different subset of the instructions in the group. As illustrated, the ALU 441 executes instructions B and D, the ALU 442 executes instructions E and K, and the ALU 443 executes the instruction Q.

Different embodiments employ different methods of assigning instructions to ALUs. In some embodiment, each ALU executes an instruction from the streaming buffer as soon as it is free to execute a next instruction. In some embodiments, a load balancing mechanism distributes the instructions to the ALUs in the array 440 to balance workload between the different ALUs. Such load balancing can be random, based on a hash, round robin, or other types of mechanisms. In some embodiments, the ALU assignment of the instructions is determined by the compiler 195, and that the streaming buffer sends each instruction to its corresponding ALU based on the predetermined assignment. In some of these embodiments, the assignment of instructions to ALUs is based on the complexity of instructions or expected execution time of instructions. Each ALU is assigned a different mix of instructions such that the different ALUs are expected to finish their assigned instructions around the same time.

In some embodiments, in order to save cost and increase memory data density, the simulation accelerator 110 employs dynamic random access memories (DRAMs) as the instruction memory 310 and the data memory 320. DRAMs are organized into pages. In some embodiments, the DRAMs are physical devices external to the IC that implements the simulation accelerator 110.

To read a data bit stored in particular page requires accessing of that page, which takes time and subjected to significant memory access latency. However, once the DRAM page is accessed, each subsequent access for data in that page requires far less time and subject to far less memory access latency. In order to minimize memory access latency for retrieving instruction or data, the simulation accelerator in some embodiments stores instructions belonging to a same group in a same page of a DRAM.

Figure 9:
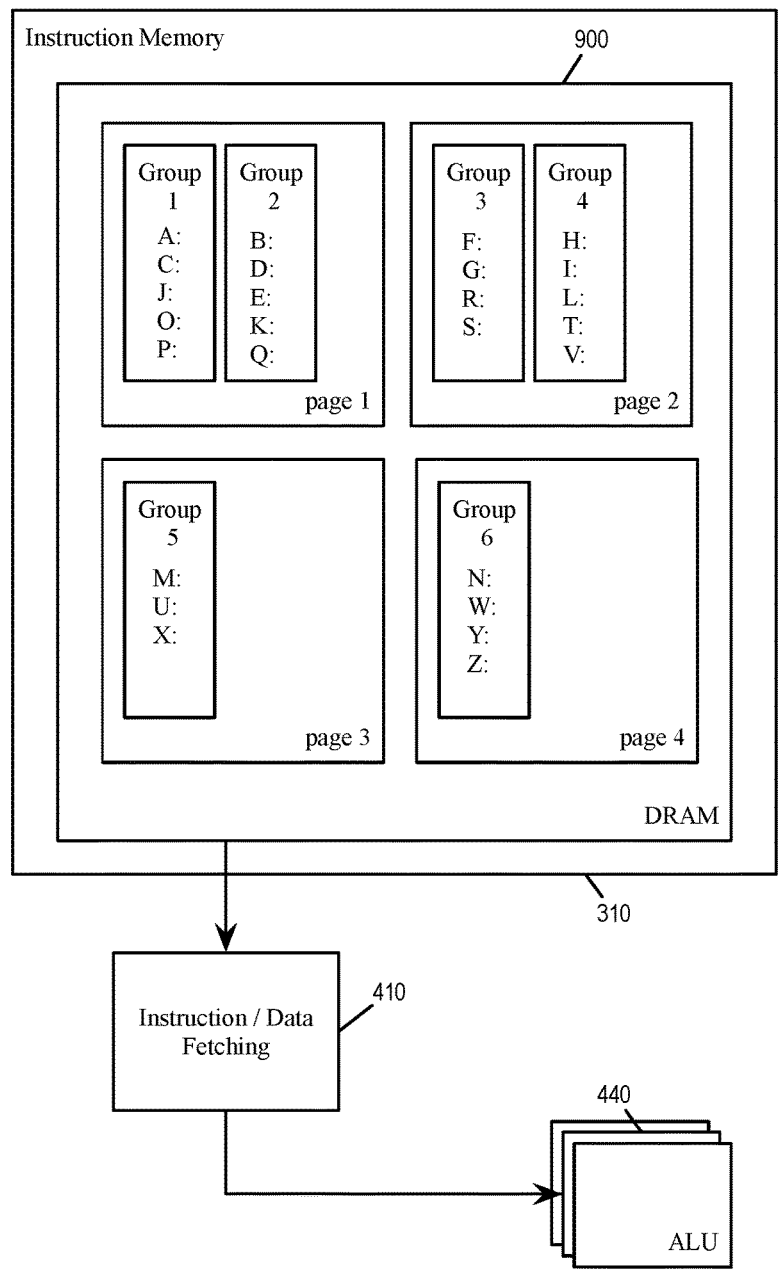
FIG. 9 illustrates storing group-sorted instructions in a DRAM in which instructions belonging to the same group are stored in a same page in order to reduce memory access latency.

FIG. 9 illustrates storing group-sorted instructions in a DRAM in which instructions belonging to the same group are stored in a same page in order to reduce memory access latency. The figure illustrates the instruction memory 310 implemented in a DRAM 900. The DRAM has at least four pages 911-914. The groups 1-6 of the instruction cloud 600 are stored in the four pages 911-914. The instructions of each group are confined to one page, though a page may store instructions belonging to multiple different groups. As illustrated, all instructions of group 1 (A, C, J, O, and P) are in page 1. All instructions of group 2 (B, D, E, K, Q) are also in page 1. All instructions of group 3 (F, G, R, and S) are in page 2. All instructions of group 4 (H, I, L, T, V) are in page 2. All instructions of group 5 (M, U, and X) are in page 3. All instructions of group 6 (N, W, Y, and Z) are in page 4. Thus, when the instruction/data fetching unit 410 fetches instructions of a group for execution at the ALUs 440, the retrieval of the instructions can stay in the same page. This minimizes memory access latency.

Figure 10:
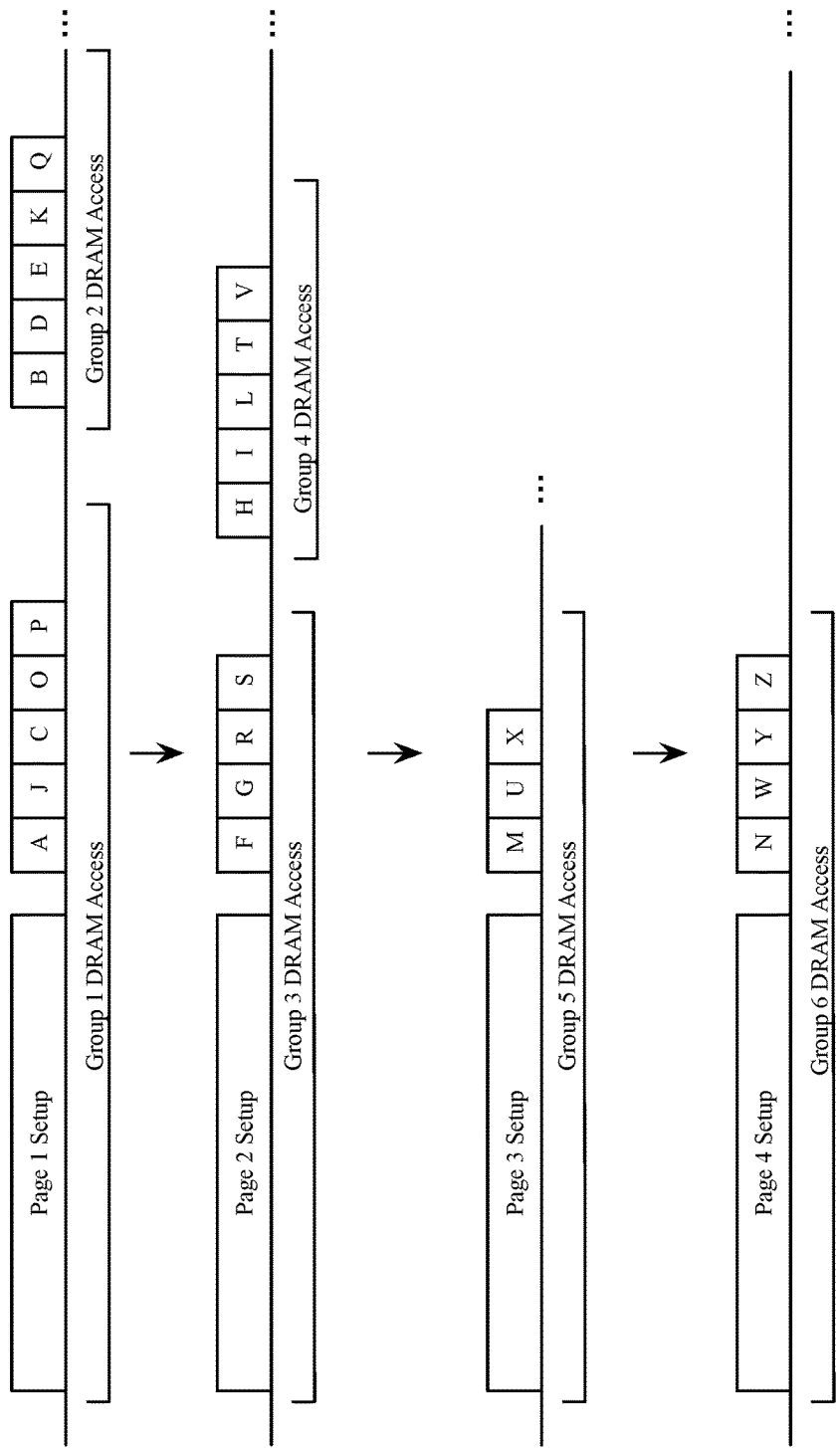
FIG. 10 illustrates the fetching of group-sorted instructions from a DRAM that stores instructions belonging to each group in one DRAM page.

FIG. 10 illustrates the fetching of group-sorted instructions from a DRAM that stores instructions belonging to each group in one DRAM page. The figure illustrates the fetching of the group-sorted instructions of the instruction cloud 600. The figure shows a time line for fetching instructions belonging to groups 1, 2, 3, 4, 5, and 6.

The instruction/data fetching unit starts by fetching instructions of group 1. Since the instructions of group 1 are all in page 1, the instruction/data fetching unit can retrieve all instructions of group 1 (A, J, C, O, P) by performing setup for accessing page 1 once (e.g., by pre-charging page 1 and setting row address). The instruction/data fetching unit then retrieve the instructions of group 2 (B, D, E, K, Q). Since the instructions of group 2 are also stored at page 1, the instruction/data fetching unit retrieves the instructions of group 2 without performing page setup.

The instruction/data fetching unit then fetches the instructions of group 3 (F, G, R, S). Since instructions of group 3 are not in page 1 but on page 2, the instruction/data fetching unit has to wait for page 2 to be setup/accessed before proceeding to retrieve the instructions of group 3. The instruction/data fetching unit then retrieve the instructions of group 4 (H, I, L, T, V) without performing page setup since group 4 instructions also reside in page 2.

The instruction/data fetching unit then fetches the instructions of group 5 (M, U, X). Since the instructions of group 5 are not in page 2 but on page 3, the instruction/data fetching unit has to wait for page 3 to be setup/accessed before proceeding to retrieve the instructions of group 5. The instruction/data fetching unit then fetches the instructions of group 6 (N, W, Y, Z). Since the instructions of group 6 are not in page 3 but on page 4, the instruction/data fetching unit has to wait for page 4 to be setup/accessed before proceeding to retrieve the instructions of group 6.

The instruction memory 310 is illustrated in FIG. 9 as being accessible to all ALUs in the array 440 so that any instruction stored in the instruction memory can be executed by any of the ALUs. However, when there is sufficiently large number of ALUs in the parallel processing array, it can be difficult to physically route data from the instruction memory to the ALUs. In some embodiments, the instruction memory 310 is divided into multiple channels, each channel serving one ALU in the array of ALUs 440. Since instructions belonging to the same group are logically independent of each other, instructions assigned to different channels of memories and ALUs can be safely executed in parallel.

In some embodiments in which the instruction memories are implemented by DRAMs, the data memories are also implemented by DRAMs, and that the input to each instruction is stored in a DRAM page of the data memory that corresponds to a DRAM page in the instruction memory that stores the instruction. In some embodiments in which the instructions are stored at instruction memories of different physical channels, the inputs to the instructions are correspondingly stored at data memories of different physical channels.

Figure 11:
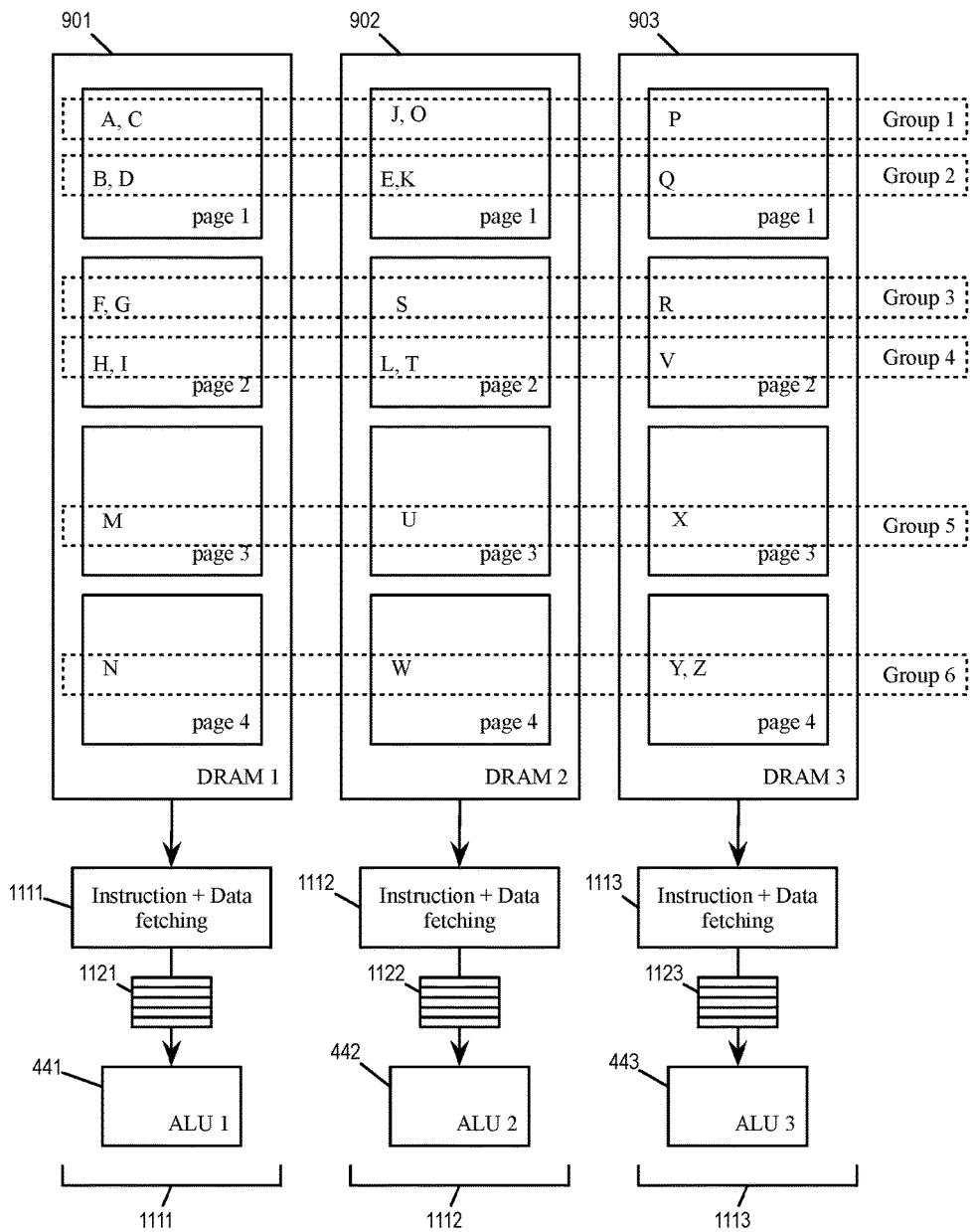
FIG. 11 illustrates the division of group-sorted instructions into multiple channels of memories and ALUs.

FIG. 11 illustrates the division of group-sorted instructions into multiple channels of memories and ALUs. The figure illustrates the instructions of the instruction cloud 600 being assigned to three channels 1111-1113. Each channel includes an instruction memory, an instruction/data fetching unit, a streaming buffer, and an ALU. Specifically, the channel 1111 includes a memory structure 901, an instruction/data fetching unit 1111, a streaming buffer 1121, and an ALU 441; the channel 1112 includes a memory structure 902, an instruction/data fetching unit 1112, a streaming buffer 1122, and an ALU 442; and the channel 1113 includes a memory structure 903, an instruction/data fetching unit 1113, a streaming buffer 1123, and an ALU 443. The ALUs 441-443 are part of the array of ALUs 440.

As illustrated, the instructions of each group are divided among the instruction memories of different channels. For example, for group 1, instructions A and C are stored in the memory 901 of channel 1111, instructions J and O are stored in the memory 902 of channel 1112, and instruction P is stored in the memory 903 of channel 1113. The ALU 441 only executes instructions fetched by the instruction/data fetching unit 1111, which fetches only instructions from the memory structure 901. The ALU 442 only execute instructions fetched by the instruction/data fetching unit 1112, which fetches only instructions from the memory structure 902. The ALU 443 only execute instructions fetched by the instruction/data fetching unit 1113, which fetches only instructions from the memory structure 903. This minimizes the routing between the ALUs and the instruction memory.

As mentioned, the instruction memory 310 can be implemented by using DRAMs, and the instructions belonging to a same group are stored in a same DRAM page. In the scenario of having the instruction memory divided into different channels, the DRAM of each channel stores instructions belonging to the same group at a same page, albeit DRAMs of different channels store different subsets of instructions from the same group. As illustrated, the DRAM 901, 902, and 903 all store instructions belonging to groups 1, 2, 3, 4, 5, and 6. All three DRAMs store their groups 1 and 2 instructions in page 1, groups 3 and 4 instructions in page 2, group 5 instructions in page 3, and group 6 instructions in page 4.

As mentioned, since the instructions belonging to the same group are logically independent of each other, they can be executed in any order by any ALUs in the array. For example, an ALU may execute the instructions of group 1 in the order of:

A, C, J, O, P

The same ALU may also execute the instructions of group 1 in the order of:

C, O, A, P, J.

In some embodiments, an ALU may execute an instruction in multiple phases, and the ALU may execute a later phase of the multi-phase instruction after an arbitrary number of other instructions. For example, say the instruction 'C' is a multi-phase instruction that is executed as phase "C1" and "C2", then the ALU may execute the instructions of group 1 in the order of:

A, C1, C2, J, O, P.

But the ALU may also execute the instructions of group 1 in the order of:

C1, O, A, P, J, C2 or:

J, C1, P, O, C2, A.

In other words, as long as the different phases of the multi-phase instruction are executed in order relative to each other, the ALU may execute each phase of the multi-phase instruction in any order relative to other instructions.

An example of an instruction that is executed as a multi-phase instruction is an indexed memory load instruction. The ALU executes a first phase to fetch the index and then a second phase to use the fetched index to fetch the memory content. The ALU in some embodiments handles the first phase of the load instruction in a separate pipeline while executing other instructions. The ALU would return to execute the second phase after the separate pipeline of the first phase has completed, which is also after some of the other instructions in the group has completed. This is permissible because the instructions belong to the same group are logically independent of each other and can be executed in any order.

C. Event Management

As mentioned, an instruction cloud is a collection of instructions that are scheduled to execute at the same time step(s). However, in some embodiments, the accelerator would actually execute an instruction only if the instruction has a pending input event. The accelerator uses the event table to keep track of pending input events and to identify instructions that need to be executed.

As instructions in each group are executed, the destinations of their outputs (also referred to as their fan-outs) may have new pending input event. Some of these destinations are instructions in other groups of the current time step. Some of these destinations are instructions to be executed at a future time step. For destination instructions that are in the same current time step as the executed instruction, the simulation accelerator uses the event table to keep track of new pending input events. For destination instructions that are in a future time step, the simulation accelerator stores the new pending input events in a storage (referred to as a "time wheel") until the future time step arrives. Once that future time step arrives, the simulation accelerator uses the content of the time wheel storage to populate the event table for the instructions of that time step.

Figure 12:
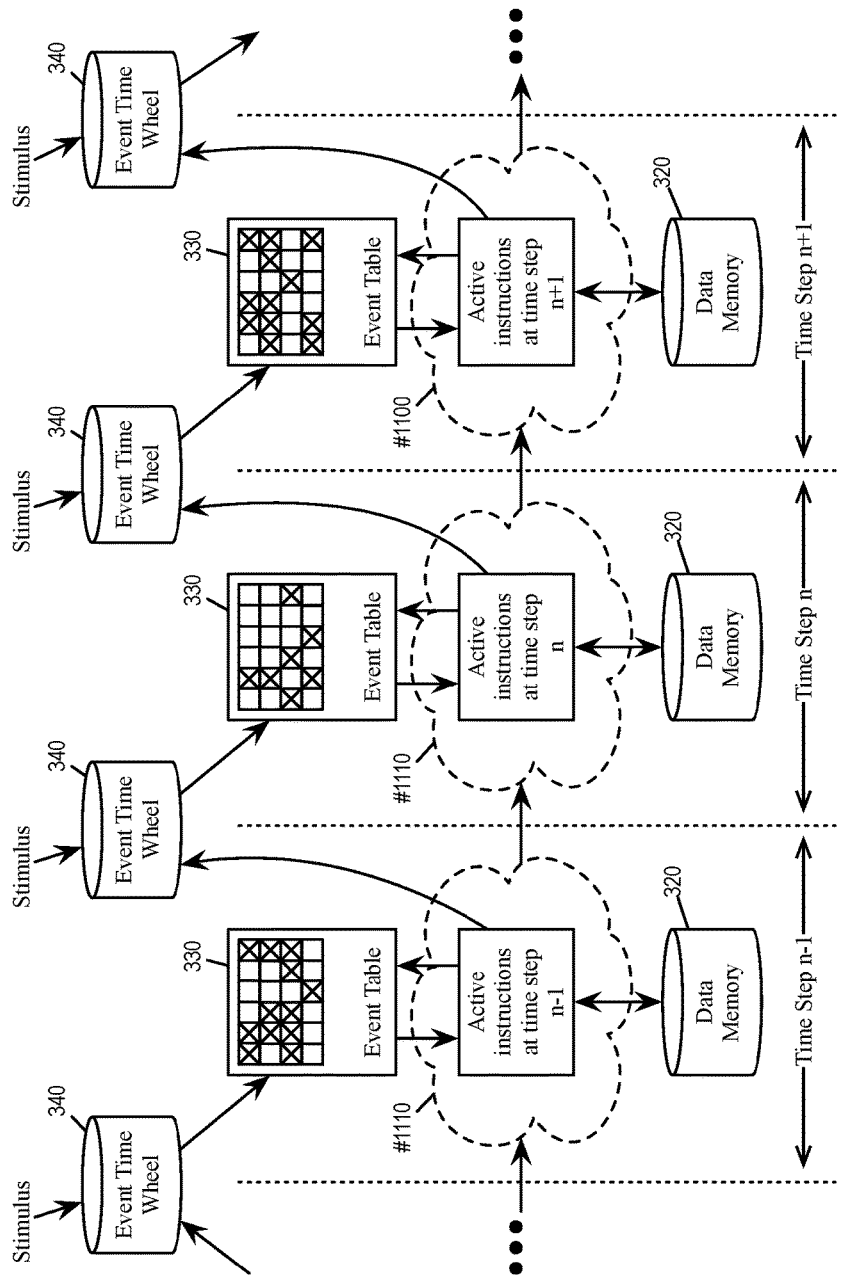
FIG. 12 conceptually illustrates the usage of the event table and the event time wheel storage.

FIG. 12 conceptually illustrates the usage of the event table and the event time wheel storage. The figure illustrates the relationship between the event table 330, the event time wheel storage 340, the data memory 320, and a compiled RTL 1210 across different time steps. The compiled RTL includes instructions that are to be executed at different time steps.

As illustrated, when the simulation time arrives at time step n, the simulation accelerator initializes the event table with the content of event time wheel 340. The event time wheel is filled with pending events generated by instructions executed at time step n−1 or before. The event time wheel is also filled with stimulus supplied by the testbench (e.g., generated by the simulation processor 120 executing programs and data 142 based on the compiled models 182). The stimulus specifies what data is to be applied and at what simulation time steps. As the simulation accelerator 110 executes the instructions of the time step n based on input data stored in the data memory 320 and generates pending events for destination instructions, it updates the event table 330 and the event time wheel 340. It also writes output data into the data memory 320 as input data to destination instructions. For destination instructions that are in time step n, the simulation accelerator updates the event table 330. For destination instructions that are in time step n+1 or after, the simulation accelerator stores the new pending input events in the event time wheel storage 340.

Figure 13A:
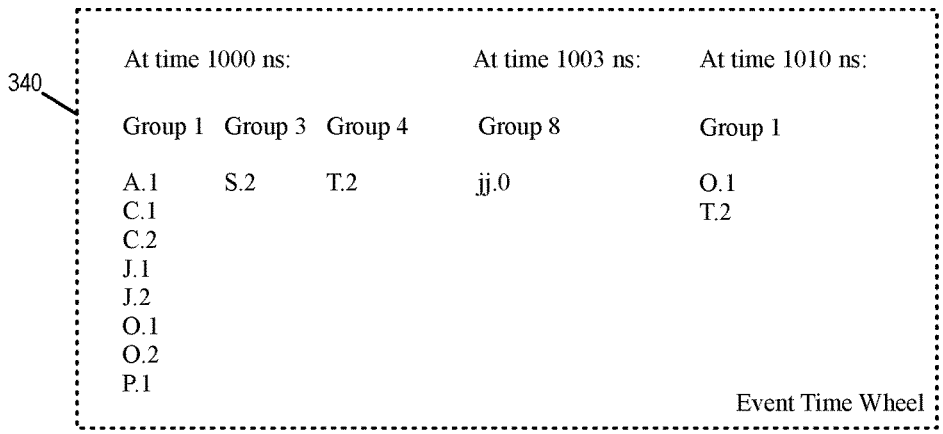
Figure 13A:
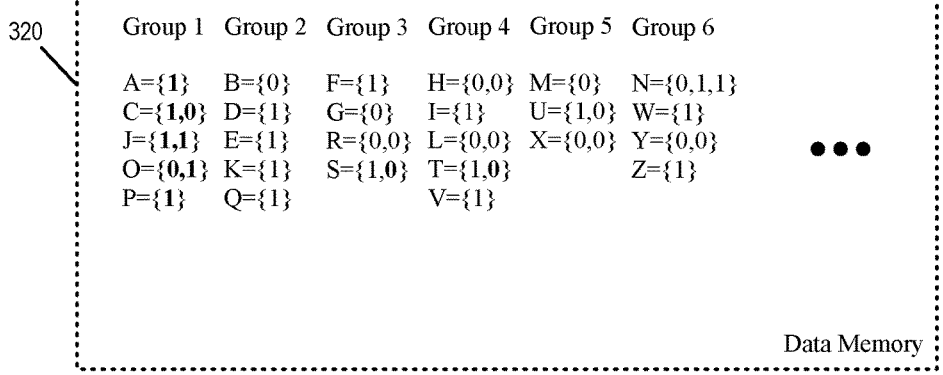
Figure 13A:
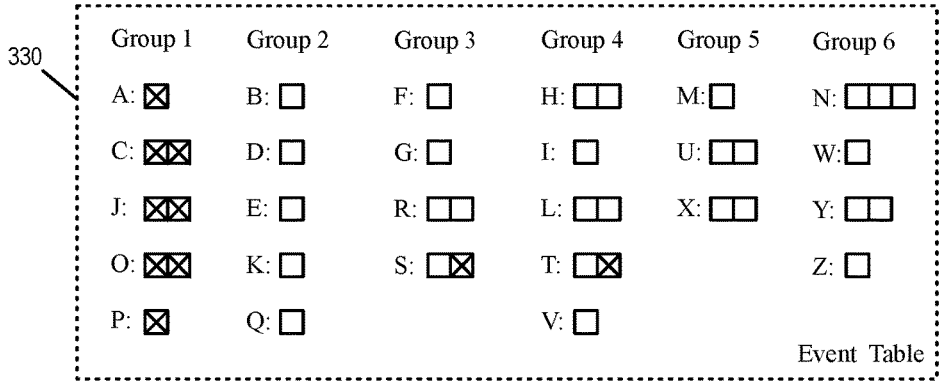

FIGS. 13a-b conceptually illustrate the content of the event time wheel storage 340, the event table 330, and the data memory 320 in different time steps.

FIG. 13a illustrates the content of the event time wheel 340 and the content of the event table 330 at a time step 1000 ns. At the time step 1000 ns, the instructions of the instruction cloud 600 (i.e., instructions A-Z) are scheduled to execute. The event time wheel 340 records pending input event for this time step (1000 ns) and other future time steps (1003 ns and 1010 ns) based on testbench stimulus and/or based on execution of previous time steps. As illustrated, the content of the event time wheel 340 indicates that there are pending input event at instructions A, C, J, O, P, S, T for the time step 1000 ns, as well as pending input event at instruction "jj" at 1003 ns, and instructions O and T at time step 1010 ns.

The data memory 320 stores the input data of every instruction in the compiled RTL, including those scheduled to be executed in this time step (i.e., instructions A-Z). The input data of some of the instructions are newly updated because of new pending input events (illustrated in bold, such as input data for instructions A, C, J, O, P, S, T).

The event table 330 keeps track of pending input events for instructions. In some embodiments, the event table maintains only pending input events for the instructions that are scheduled to execute for the current time step. When the simulation time initially arrives at a particular time step, the accelerator populates the event table 330 based on the pending input events for the current time step stored in the event time wheel 340. (The events from previous time steps would have already been cleared).

In some embodiments, the event table 330 is maintained as a collection or a scoreboard of bits, each bit indicating absence or presence of pending event at an input of an instruction. The event table 330 is therefore also referred to as a pending events table. Each instruction has a corresponding bit in the event table 330 for indicating whether there is a pending input event for the instruction. In some embodiments, each input of each instruction has a corresponding bit for indicating whether there is a pending event at that input. As illustrated in FIG. 13a, bits in the event table 330 that correspond to instructions A, C, J, O, P, S, and T are set to indicate pending event at these instructions, while bits correspond to other instructions are cleared to indicate that there are no pending events at those other instructions. In some other embodiments (not illustrated), the event table only keeps track of whether an instruction has any pending input event at all (i.e., whether the instruction has least one input with input event), rather than keeping track of pending events for each input of each instruction.

In the example illustrated in FIG. 13a, the event table 330 keeps track of pending events for instructions in groups 1-6, as these are the instructions that are scheduled to execute in the current time step. The event table 330 is populated with input events at A, C, J, O, P, S, and T based on the content of the event time wheel 340 for the time step 1000 ns.

In some embodiments, the bits of the event table 330 are bundled into wide words for the simulation accelerator 110 (at e.g., event manager 430) to quickly access. Each bit in this wide word corresponds to an instruction for indicating whether the instruction has a pending event at its input(s). Bits that correspond to instructions of a same group are located in the same word of the pending events table. In some embodiments, all bits that correspond to instructions of a same instruction cloud are stored at a same word for quick access by the event manager 430. This allows the simulation accelerator to examine the pending input event status of many instructions at the same time, such as when determining which group of instructions has pending events. This also minimizes memory access latency when retrieving and updating pending input events in the event table 330.

For some embodiments, the event time wheel storage 340 can be considered as a collection of initial content for the event table at different time steps. When the simulation accelerator arrives at the current time step, the simulation accelerator 110 (at the event manager 430) retrieves from the event time wheel storage 340 the initial content of the event table for the current time step. The storage in the event time wheel 340 allocated to storing the initial content the event table of the current time step is then freed so the event time wheel 340 may store the initial content of the event table of a future time step.

FIG. 13b illustrates the content of the event time wheel 340 and the initial content of the event table 330 at a time step 1003 ns. At the time step 1003 ns, the simulation accelerator has completed executing the instructions of the time step 1000 ns (groups 1-6) and is set to execute the instructions of the time step 1003 ns (groups 7-11). The execution of the instructions of the time step 1000 ns has updated the content of time wheel 340. According to the updated time wheel 340, there are pending events at inputs of instructions aa, bb, cc, dd, gg, and jj. These are initial content of the event table 330 for the time step 1003 ns. When the simulation time reaches the time step 1003 ns, the simulation accelerator populates the event table 330 with its initial content for the time step 1003 ns stored in the event time wheel 340, specifically setting pending input events for instructions aa, bb, cc, dd, gg, and jj based on the content of the event time wheel 340. The event table 330 is now ready to maintain pending input events of groups 7-11.

FIGS. 14a-d illustrate the use of event table and event time wheel during execution of group-sorted instructions of a time step. As illustrated, the event table 330 has bits that correspond to inputs of instructions A through Z sorted into groups 1-6 (of the instruction cloud 600). The figures illustrate the execution of the instruction groups 1-6 at the time step 1000 ns in eight stages 1401-1408.

The first stage 1401 shows the simulation accelerator 110 (or the event manager 430) with the event table 330 cleared of any pending events for the current time step. The simulation accelerator then populates the bits of the event table 330 according to the content of the event time wheel 340, which stores the initial content of the event table for time step 1000 ns.

The second stage 1402 shows the event table populated with pending input events based on the content of the event time wheel (based on the example shown in FIG. 13a at time step 1000 ns). As illustrated, bits corresponding to inputs of the instructions A, C, J, O, P, S, and T are set to indicate pending input events, while other bits are not set to indicate that there are no pending input events at those inputs.

The third stage 1403 shows the selection of group 1 for execution. The accelerator in some embodiments selects a group of instructions by examining the bits of the event table, i.e., to select a group having pending input events. Since there are multiple groups with pending input events (groups 1, 3, and 4), the accelerator selects a group with pending input events that does not depend on any group within the time step. In some embodiments, this group is identifiable as the group having the lowest group number in the time step. In this case, group 1 is selected for execution because its instructions do not depend on other groups for input.

The stage 1403 also shows the fan-out of each instruction in the executed group 1. In this example, the output of A fans out to B, the output of C fans out to D and E, the output of J fans out to K, the output of O fans out to R, and the output of P fans out to Q. The corresponding bits of these destination instructions (B, D, E, K, R, and Q) will be set to indicate that there are pending input events.

At the fourth stage 1404, the bits that correspond to the inputs of group 1 instructions have been cleared. The stage 1404 also shows the selection of group 2 for execution. This is because group 2 has pending input events at its instructions (B, D, E, K, Q). This is also because the instructions of group 2 depend on only instructions in groups that have already executed (i.e., group 1). The stage 1404 also shows the output of B fans out to "aa", the output of D fans out to F, the output of E fans out to G, the output of K fans out to L, X, and Y, the output of Q fans out to R and S. The corresponding bits of these destination instructions (F, G, L, X, Y, R, S) will be set to indicate that there are pending input events. The instruction "aa" is in a future time step 1003 ns, so the accelerator records the pending input event in the event time wheel 340 for the future time step.

At the fifth stage 1405, the bits that correspond to the inputs to group 2 instructions have been cleared. The stage 1405 also shows the selection of group 3 for execution. This is because group 3 has pending input events at its instructions (F, G, R, S). This is also because the instructions of group 3 depend on only instructions in groups that have already executed (i.e., groups 1 and 2). The stage 1405 also shows the output of F fans out to H and L, the output of G fans out to I, the output of R fans out to V, the output of S fans out to T and U. The corresponding bits of these destination instructions (H, I, L, T, V, U) will be set to indicate that there are pending input events.

At the sixth stage 1406, the bits that correspond to the inputs to group 3 instructions have been cleared. The stage also shows the selection of group 4 for execution. This is because group 4 has pending input events at its instructions (H, I, L, T, V). This is also because the instructions of group 4 depend on only instructions in groups that have already executed (i.e., groups 1, 2, and 3). The stage 1406 also shows the output of H fans out to N, the output of I fans out to N, the output of L fans out to M, the output of T fans out to U, and the output of V fans out to X. The corresponding bits of these destination instructions (N, M, U, X) will be set to indicate that there are pending input events.

The seventh stage 1407 shows bits that correspond to the inputs to group 4 instructions have been cleared. The stage also shows the selection of group 5 for execution. This is because group 5 has pending input events at its instructions (M, U, X). This is also because the instructions of group 5 depend on only instructions in groups that have already executed (i.e., groups 1, 2, 3, and 4). The stage 1407 also shows the output of M fans out to N, the output of U fans out to W, and the output of X fans out to Y and Z. The corresponding bits of these destination instructions (N, W, Y, Z) will be set to indicate that there are pending input events.

The eighth stage 1408 shows bits that correspond to the inputs to group 5 instructions have been cleared. The stage also shows the selection of group 6 for execution. This is because group 6 has pending input events at its instructions (N, W, Y, Z). This is also because the instructions of group 6 depend on only instructions in groups that have already executed (i.e., groups 1, 2, 3, 4, and 5). The stage 1408 also shows the output of N fans out to "bb", the output of W fans out to "cc", the output of Y fans out to "dd", and the output of Z fans out to "gg". The instructions "bb", "cc", "dd", and "gg" are all in a future time step 1003 ns, so accelerator records the pending input event in the event time wheel 340 for the future time step.

After the stage 1408, the bits that correspond to the inputs to group 5 instructions have also been cleared. This would leave the event table empty for the 1000 ns time step. The simulation accelerator (at the event manager 430) would therefore know that there is no more pending event for the current time step 1000 ns, and the simulation may proceed to the next time step 1003 ns. The event time wheel 340 and the event table 330 at start of the time step 1003 ns are provided by FIG. 13*b* above.

In the example illustrated in FIGS. 14*a-d*, the output of every instruction executed generates pending event that fans out. However, not all executions of an instruction result in changes at the instruction's output. (For example, changes at one input of a NAND gate when the other input is held at 0 would not result in a change in NAND gate's output). If the output of an instruction does not change following the instruction's execution, the simulation accelerator in some embodiments would not follow the fan-out of the instruction to update the event table, the event time wheel, or the data memory.

D. Instruction Execution

In some embodiments, the input data to an instruction is (are) stored at a same address location as the instruction itself. In other words, when the simulation accelerator 110 (at its instruction/data fetching unit 410) fetches an instruction for execution, the same address that is used to fetch the instruction is also used to fetch the input data to the instruction. In some embodiments, each instruction is stored at a same memory word as its inputs. This ensures that the simulation accelerator does not incur any additional memory access latency when fetching input data for an instruction.

Figure 15:
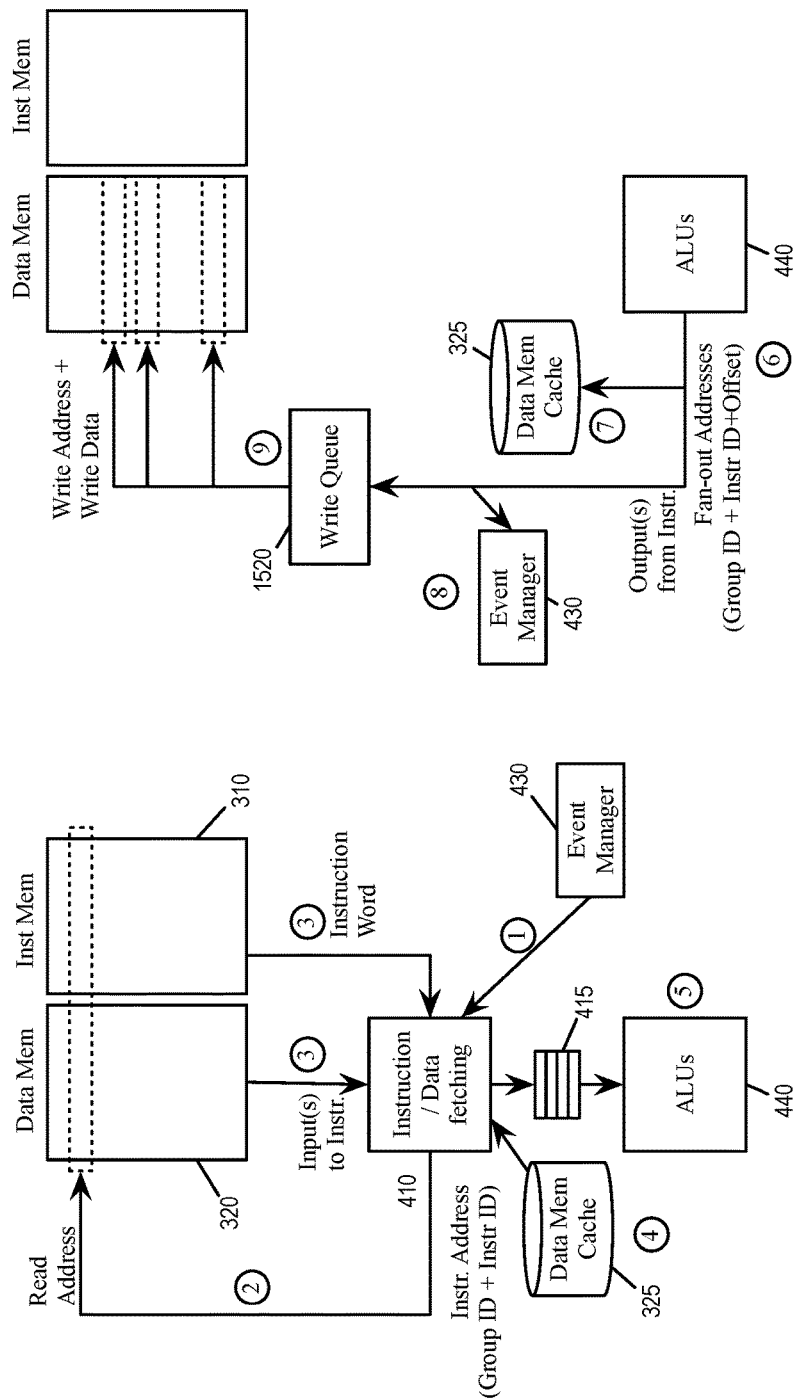
FIG. 15 illustrates the data flow during the execution of an instruction at the simulation accelerator.

FIG. 15 illustrates the data flow during the execution of an instruction at the simulation accelerator. The figure illustrates the instruction/data fetching unit 410 fetching the instruction and its corresponding input data from the instruction memory 310 and data memory 320. The ALUs 440 executes the fetched instruction based on fetched input data. The output of the instruction execution is written back to the data memory 320 as input for other instructions. The figure illustrates the execution of the instruction in nine operations labeled '1' through '9'.

At the operation labeled '1', the instruction/data fetching unit 410 determines which instruction to fetch and execute based on the content of the event table (as managed by the event manager 430)

At the operation labeled '2', the instruction/data fetching unit 410 issues an address for fetching an instruction and its corresponding input data. As mentioned, the instruction and its corresponding input data are stored at address locations that are accessible by the same address value.

At the operation labeled '3', the instruction/data fetching unit 410 retrieves the content of the addressed memory locations from both the instruction memory and the data memory. The fetched instruction and input data are forwarded to the ALU 440. In some embodiments, the fetched instruction and input data are buffered at the streaming buffer 415, which is a memory structure capable of storing multiple instructions and their corresponding inputs.

At the operation labeled '4', the instruction/data fetching unit retrieves input data from a data memory cache 325 if there is a cache hit. The data memory cache 325 is a cache that intercepts and stores outputs of recently executed instructions. In some embodiments, the input data required by the instruction can be the output of a recently executed instruction that may not have already been written back into the data memory (but is instead waiting in a write queue 1520). The output of the recently executed instruction is available in the data memory cache 325. When there is a cache hit, the input data fetched from the data memory cache 325 replaces the input data fetched from the data memory 320 since the input data fetched from the data memory 320 may not be up to date.

The data memory cache 325 is a low latency memory structure (e.g., static RAM) for temporarily storing output data produced by the ALUs. Outputs of each instruction is temporarily held in the data memory cache 325 such that subsequent instructions can retrieve their inputs quickly from the data memory cache 325 instead of from the data memory 320. The data memory cache 325 as a temporary storage holds only output data from instructions that are recently executed. A cache hit indicates that the requisite input is available in the data memory cache because the input is the output of a recently executed instruction. A cache miss on the other hand indicates that the requisite input is not available in the data memory cache because the input is the output of an instruction not so recently executed. In that case the updated input data is assumed to already be in the data memory 320.

Figure 14A:
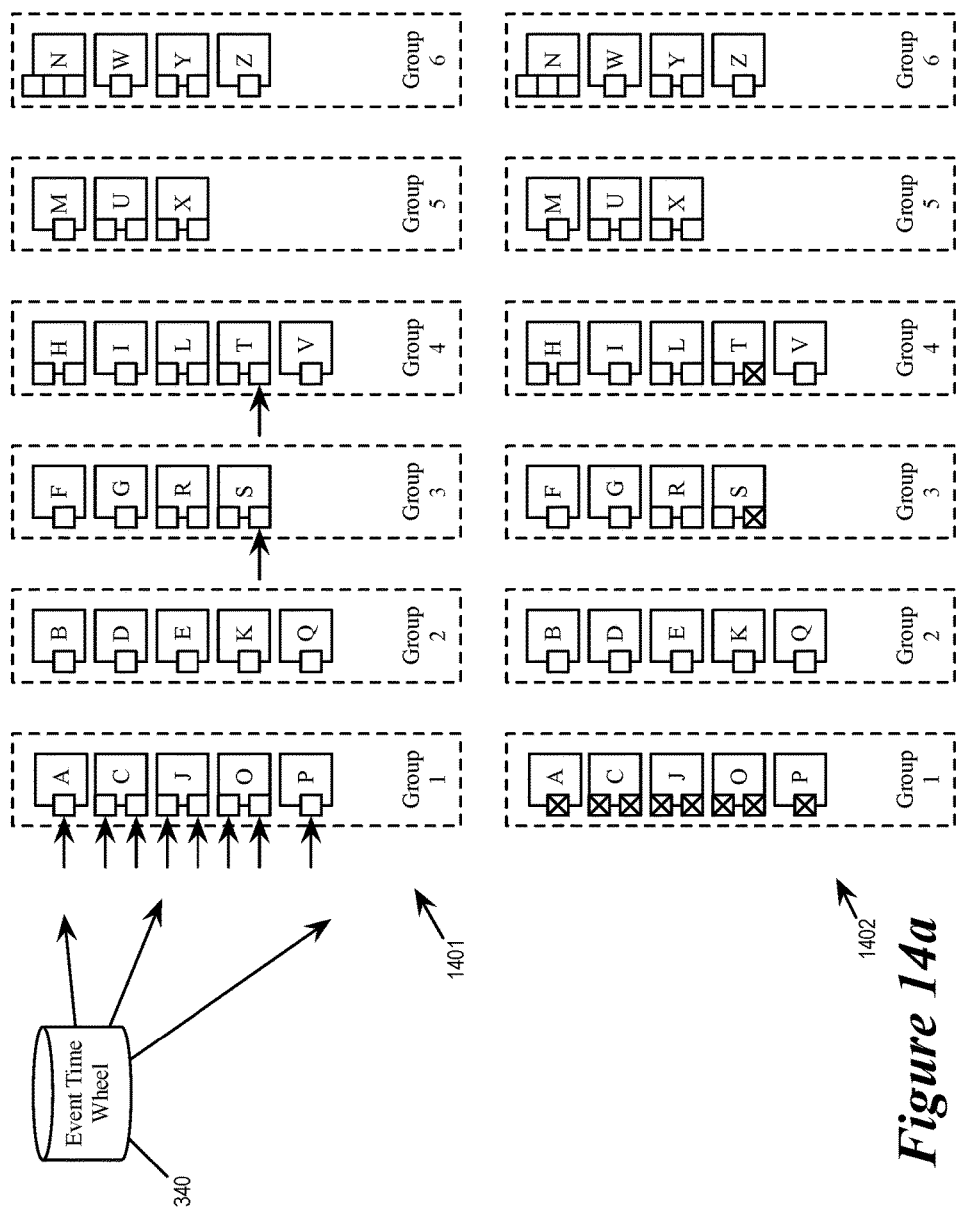
FIGS. 14a-d illustrate the use of event table and event time wheel during execution of group-sorted instructions of a time step.
Figure 14B:
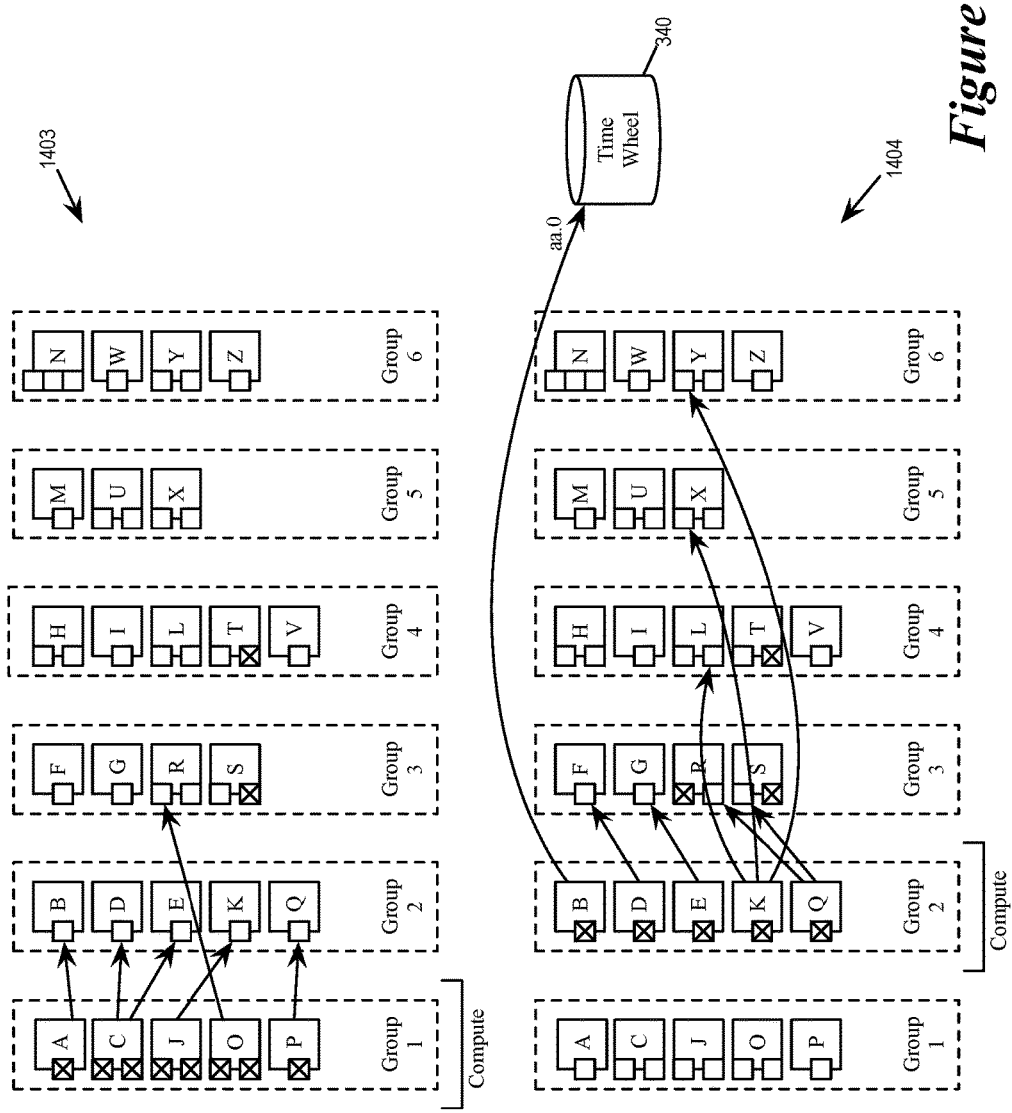
Figure 14C:
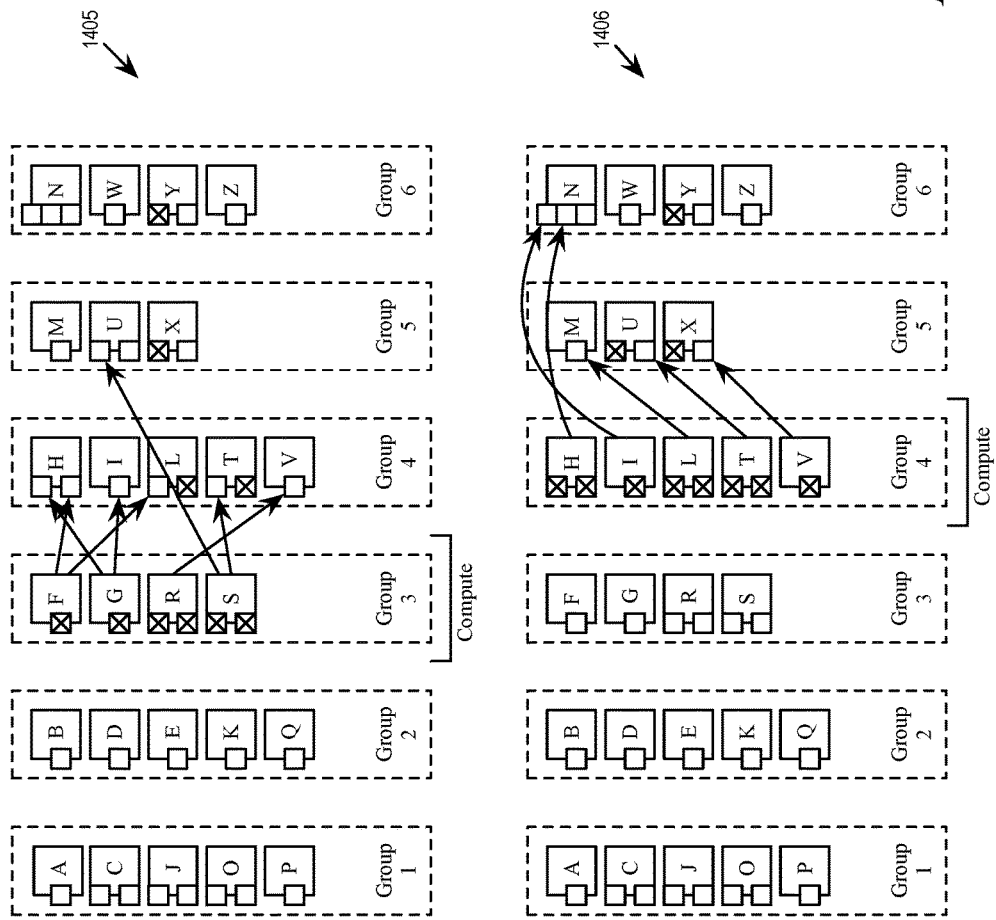
Figure 14D:
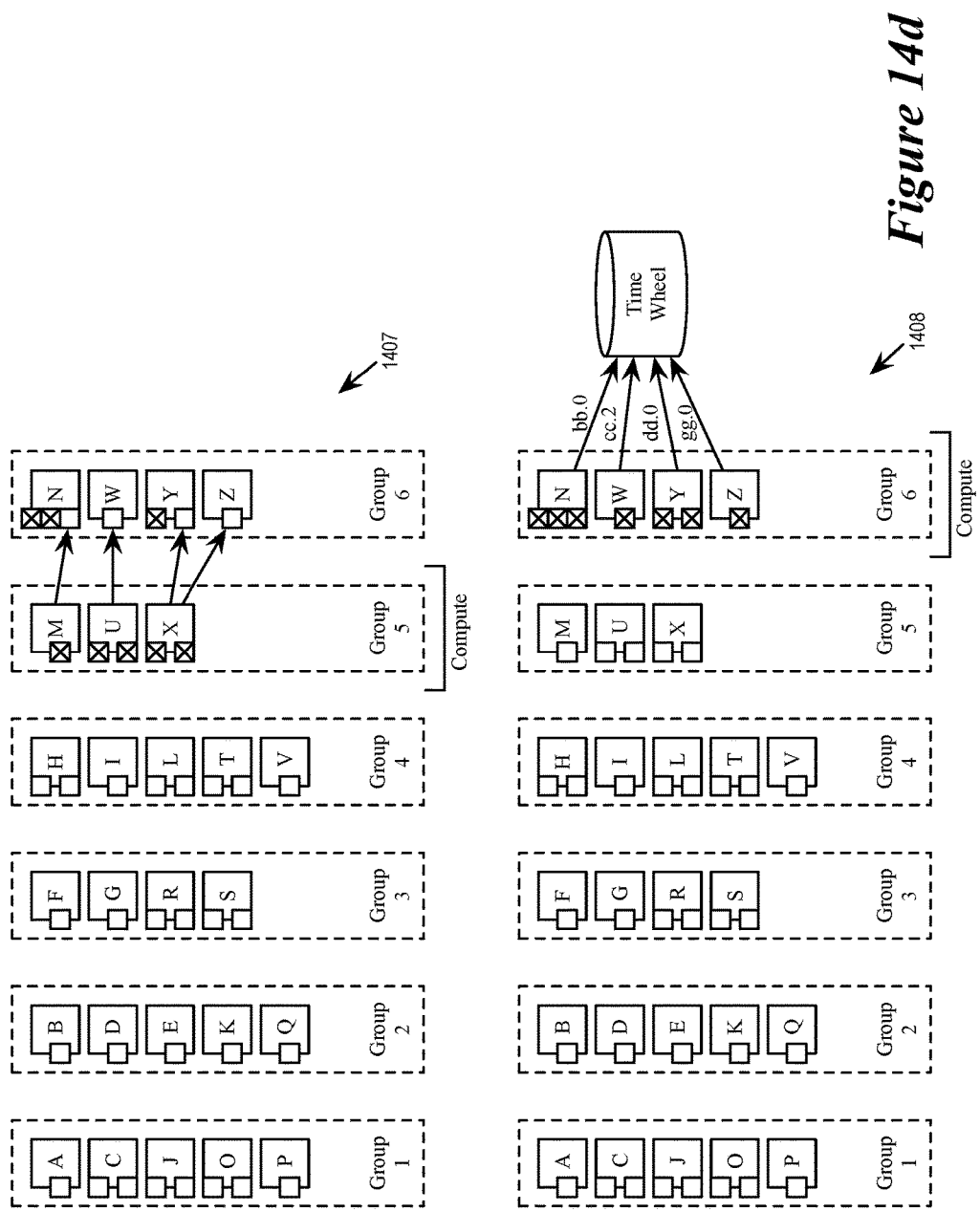

For example, in FIG. 14*a*, the output data produced by instructions of group 1 are stored in the data memory cache 325 and are available as input data for instructions of group 2, and the output data produced by the instructions of group 2 are stored in the data memory cache 325 and are available as input data for instructions of group 3, etc. A larger data memory cache 325 would be able to hold data longer such that the output data produced by a particular group of instructions can be available as input data for more subsequent groups of instructions.

At the operation labeled '5', the ALU 440 executes the fetched instruction based on its corresponding fetched input data.

At the operation labeled '6', the ALU 440 writes the output of the executed instruction to its destination(s). An instruction that produces an output also specifies the fan-out destination instruction(s) that is (are) to receive the output. For each fan-out destination that is to receive a copy of the instruction' output data, the instruction specifies an address tuple that includes the destination's group identifier, instruction address, and input offset. The address tuple is used to specify the location in the data memory that is to store the output data. The address tuple and the output data are stored in the write queue 1520 to wait for opportunity to be written into the data memory.

Since the instructions are executed on a group-by-group basis and the outputs of the instructions in a current group are always destined for instructions in subsequent groups, the outputs of the instructions of the current group can be kept in the write queue 1520 until after the current group has completed execution. This minimizes memory access latency by not interfering with page read operations. In some embodiments, the data access unit 420 manages the queuing of write operations at the write queue 1520. In some embodiments, a destination location that is in the same DRAM page as the current group is written as soon as the execution of the current group of instructions is complete, while a destination location that falls outside of the current DRAM page is written later to minimize DRAM page access setup cost.

At the operation labeled '7', the output data produced by the ALU 440 is written into the data memory cache 325 so the data will be available as input data for instructions to be executed at the near future (e.g., instructions in the next group).

At the operation labeled '8', the data access unit 420 updates the event table 330 and/or the event time wheel 340 through the event manager 430. The event manager 430 clears the pending input events for instructions that were just executed and sets pending input events for destination instructions.

At the operation labeled '9', the data access unit 420 moves the output data from the write queue 1520 to the data memory 320. Each output data has one or more fan-out destinations that informs the data access unit 420 where to write the output data. Each fan-out destination is a location in the data memory 320 that corresponds to the input area of a destination instruction. That destination instruction will use the output data written in that destination location as input for execution. Writing instruction's output data to the data memory will be further described by reference to FIGS. 19, 20, and 21 below.

Figure 16:
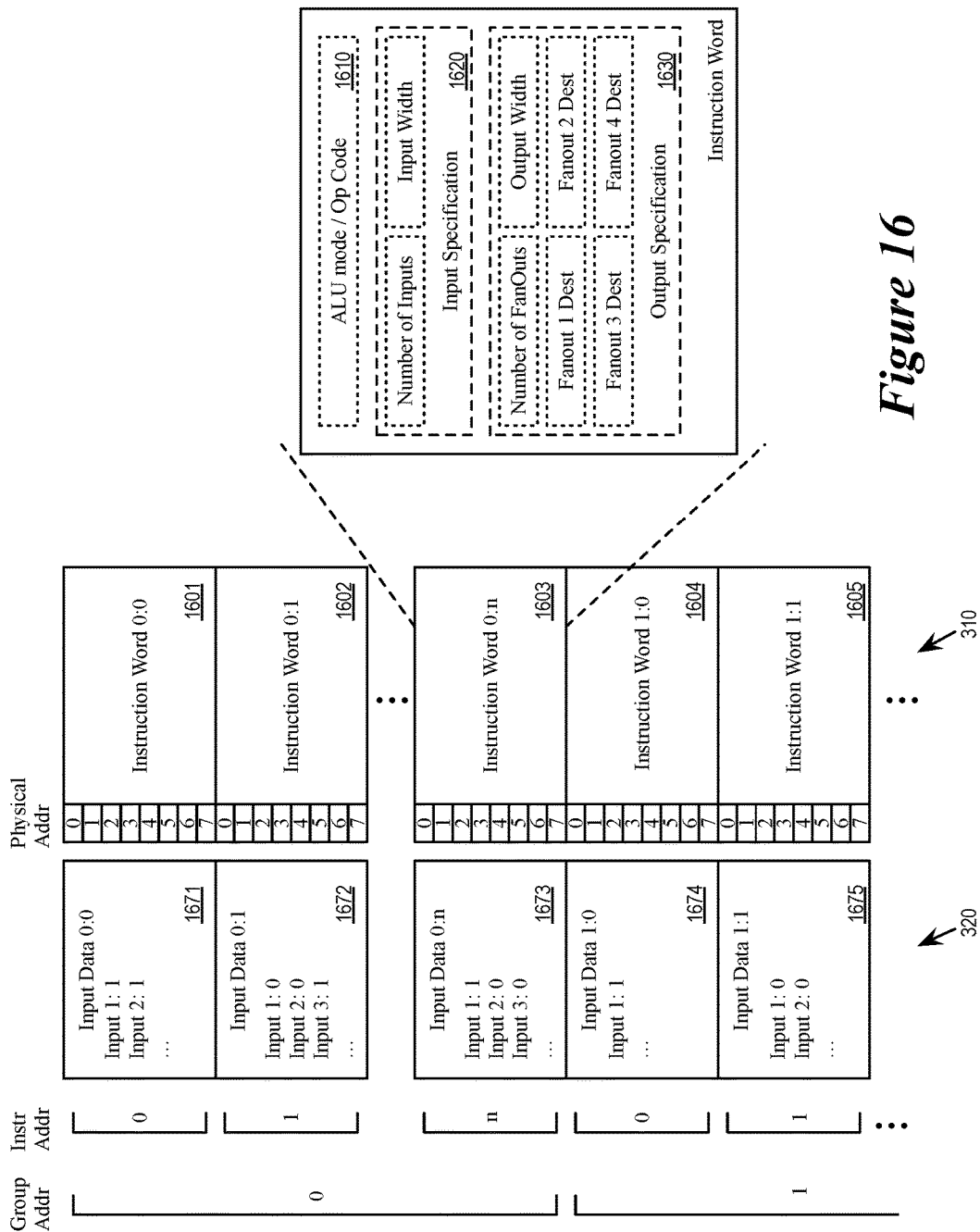
FIG. 16 illustrates the format of the content in the instruction memory and in the data memory.

FIG. 16 illustrates the format of the content in the instruction memory and in the data memory. As mentioned, the instructions of the simulation accelerator are group-sorted. The storage of instructions at the instruction memory and the storage of inputs at the data memory are correspondingly group-sorted. As illustrated, each group of instructions has a unique identifier, and the group identifier is used as the most significant part of the address for accessing instructions and data. Thus, the instructions and their input data are organized into groups by virtue of having different group identifier. Within each group, each instruction has an instruction address that is unique within the group. In some embodiments, this instruction address serves as the next significant part of the address (after group identifier) for accessing instructions and data. In some embodiments, each group may have up to 2048 instructions (11 address bits).

For some embodiments, each instruction includes several physical words in the physical memory. In the example illustrated in FIG. 16, each instruction includes 8 physical words covering 8 physical address locations. The same group identifier, instruction address, and physical word address are used to fetch the instruction from the instruction memory 310 and to fetch the input data from the data memory 320.

The figure shows the format of the content of each instruction. As illustrated, the words allocated to an instruction in the instruction memory 310 contain various components of the instruction, including its ALU opcode 1610, input specification 1620, and output specification 1630. The ALU opcode 1610 specifies the operations that an ALU (in the ALU array 440) will perform when executing the instruction. The input specification 1620 specifies the format of the input data at the data memory 320 for the instruction, e.g., the number of inputs and the width of the inputs.

The output specification 1630 specifies the fan-out of the instruction, i.e., where should the simulation accelerator store the output of the instruction execution. As illustrated, the output specification 1630 specifies the number of destinations (i.e., the number of fan-outs), and the location of each destination. Each destination location specifies an input of a destination instruction by specifying the group identifier of the destination instruction, the instruction address of the destination instruction, and an input offset targeting a specific input of the destination instruction.

The figure also shows the format of the data memory 320. The data memory stores the corresponding input data for instructions in the instruction memory. For example, the instruction 1601 has corresponding input area 1671 in the data memory, the instruction 1602 has corresponding input area 1672 in the data memory, etc. For each instruction, the data memory stores its input data according to the format specified by the instruction (i.e., the input specification 1620), which specifies the number of inputs and the width of each input. When an earlier executed instruction (or source instruction) specifies say, instruction 1673 as one of its destination instructions, the simulation accelerator would store the output of the earlier executed instruction into the input area 1673 of the instruction 1603 (at the input offset specified by the source instruction targeting one of the inputs in the input area 1673).

As mentioned, in some embodiments, the simulation accelerator would not write the output of an instruction to its fan-out destinations if the execution of the instruction does not change its output. In some embodiments, the simulation accelerator stores a copy of the output of the instruction at the instruction's input area. This allows the simulation accelerator to determine whether the execution of the instruction has changed its output by comparing the new output of the instruction with its previous output stored at the data memory.

Figure 17:
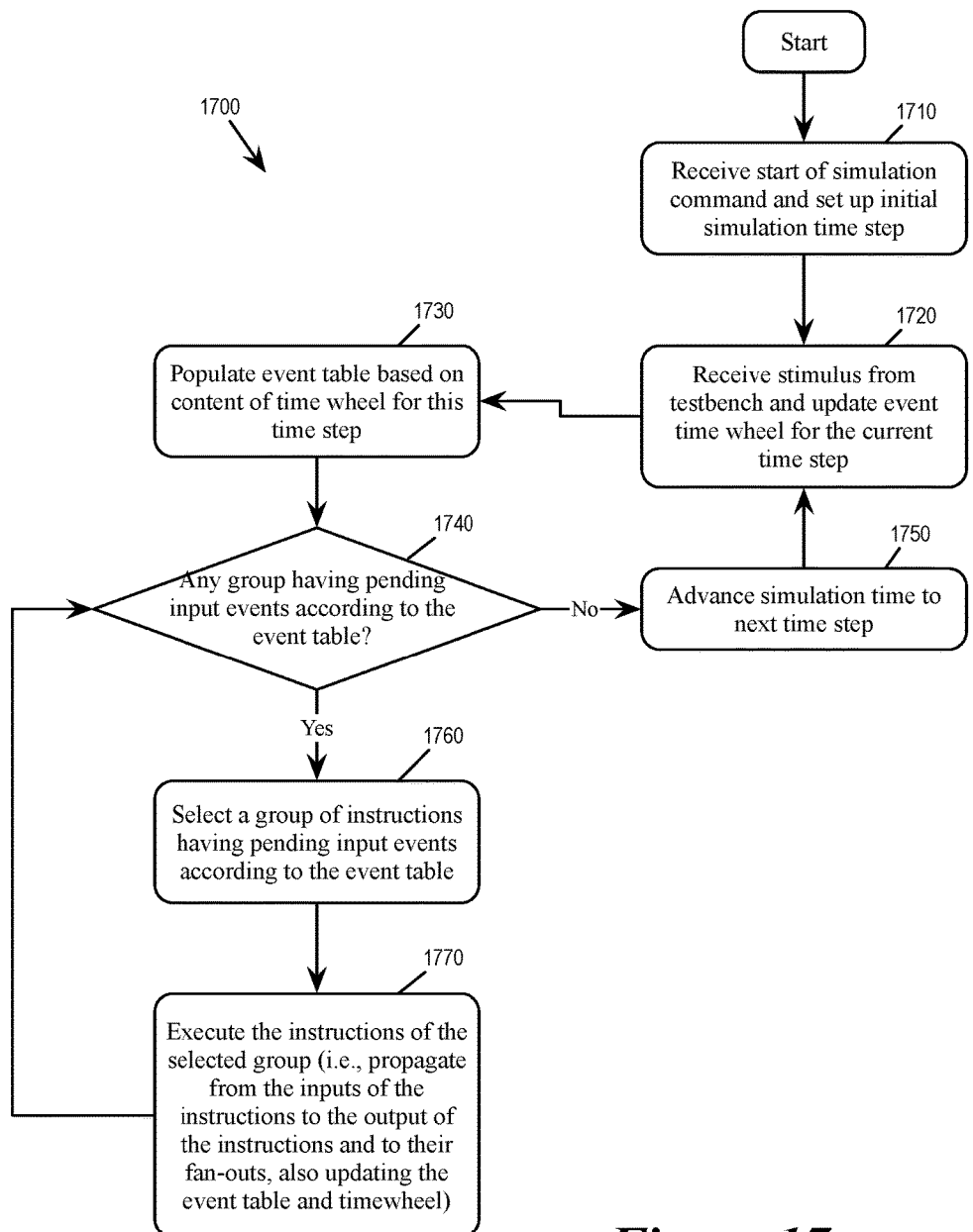
FIG. 17 conceptually illustrates a process for performing RTL simulations by using a simulation accelerator.

FIG. 17 conceptually illustrates a process 1700 for performing RTL simulations by using a simulation accelerator. The simulation accelerator 110 performs the process 1700 when it executes group-sorted instructions. Before the start of the process 1700, the simulation accelerator 110 has already received compiled RTLs in the form of group-sorted instructions from the compiler 195. The group-sorted instructions are stored in the instruction memory of the simulation accelerator 110. The process 1700 starts when the simulation accelerator receives (at 1710) a command to commence simulation from the host computer 190, or from the simulation processor 120. The process also sets the time step to an initial simulation time specified by the user through the host computer (usually 0).

The process 1700 receives (at 1720) stimulus from testbench and update event time wheel for the current simulation time step. In some embodiments, the testbench includes models for providing stimulus to test the DUT RTL. Some of these models are programs compiled to run on the simulation processor 120, and the simulation processor 120 provides the stimulus to the simulation accelerator 110 to drive the RTLs. The simulation accelerator in turn stores the received stimulus in the event time wheel. The process then populates (at 1730) the event table for the current time step based on the content of the event time wheel. The event table records the pending input event status for the instructions that are active for the current time step. The operations related to event time wheel and event table are described in Section III.C above.

Next, the process 1700 determines (at 1740) whether any group of instructions in the compiled RTL has pending input events according to the event table. If the event table is cleared of any pending input event for the current time step, the process proceeds to 1750. If the event table indicates that there are still pending input event for the current time step, the process proceeds to 1760.

At 1750, the process 1700 advances the simulation time to the next time step and returns to 1720 to update event time wheel and event table. If the current time step is the last time step in the simulation (as specified by the user or by the testbench), the process 1700 ends.

At 1760, the process 1700 selects a group of instructions having pending events at their inputs according to the event table. In some embodiments, when there are multiple groups of instructions having pending input events, the process selects a group whose group identifier is the lowest, or a group that does not depend on any group within the time step that has pending input events. The process then proceeds to 1770.

At 1770, the process 1700 executes the instructions of the group. In some embodiments, the process fetches the instructions and their corresponding input data into a streaming buffer by using burst mode. The process executes the instructions in the streaming buffer, updates the event table, and writes output data to the data memory according to the executed instruction. In some embodiments, the process performs the operation 1770 by performing the process 1800 of FIG. 18. The process then returns to 1740 to execute another group of instructions in the same simulation time step or in the next simulation time step.

Figure 18:
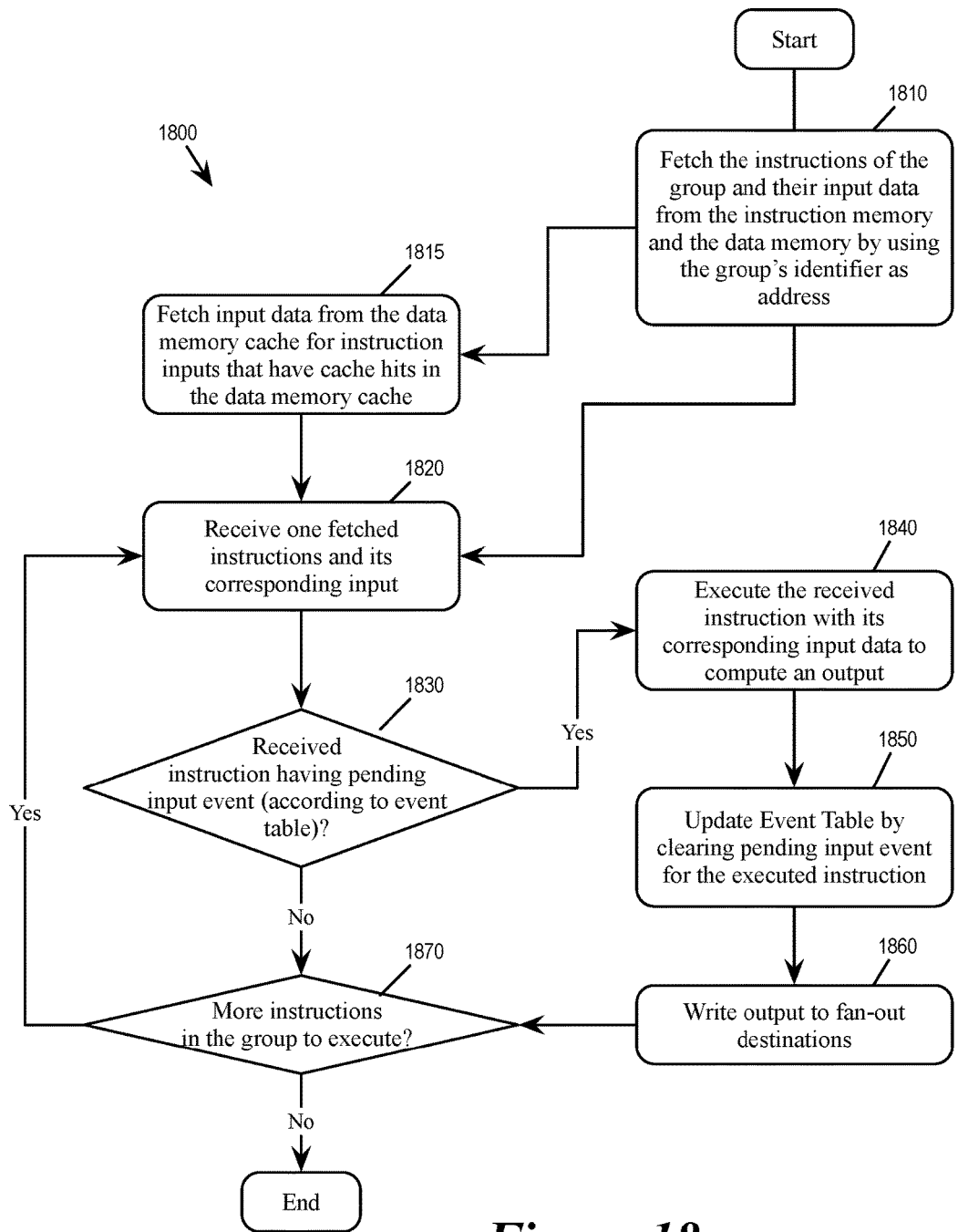
FIG. 18 conceptually illustrates a process for executing a group of instructions.

FIG. 18 conceptually illustrates a process 1800 for executing a group of instructions. In some embodiments, the simulation accelerator performs the process 1800 when it performs the operation 1770.

The process 1800 starts by fetching (at 1810) the instructions of the group and their corresponding input data by using the identifier of the group as address to the instruction memory and data memory. In some embodiments, only instructions that are identified as having pending input by the event table are fetched. The fetched instructions and data are stored into a streaming buffer. For some embodiments in which the simulation accelerator uses a data memory cache to store output data from recently executed instructions, the process also fetches (at 1815) input data from the data memory cache for instruction inputs that have valid corresponding entries in the cache (i.e., cache hit).

Next, the process 1800 receives (at 1820) one fetched instruction and its corresponding input data (from the streaming buffer). The process then determines (at 1830) whether the received instruction has pending input event by examining the event table. If so, the process proceeds to 1840. If the received instruction has no pending input event, the process proceeds to 1870.

At 1840, the process 1800 executes the received instruction with its corresponding input data to compute an output. The process then updates (at 1850) the event table by clearing the pending input event for the executed instruction. The process 1800 then proceeds to 1860.

At 1860, the process 1800 writes the output of the executed instruction to its fan-out destination locations in the data memory. The process then proceeds to 1870. In some embodiments, the simulation accelerator stores the output data write operation in a write queue (e.g., the write queue 1520) while the process 1800 proceeds to execute other instructions.

At 1870, the process 1800 determines whether there are more instructions in the group that have yet to be executed. The process in some embodiments makes this determination by examining whether there are more instructions in the streaming buffer that have yet to be executed. If there is at least one more instruction yet to be executed, the process returns to 1820 to receive and execute another instruction. Otherwise, the process 1800 ends.

Figure 19:
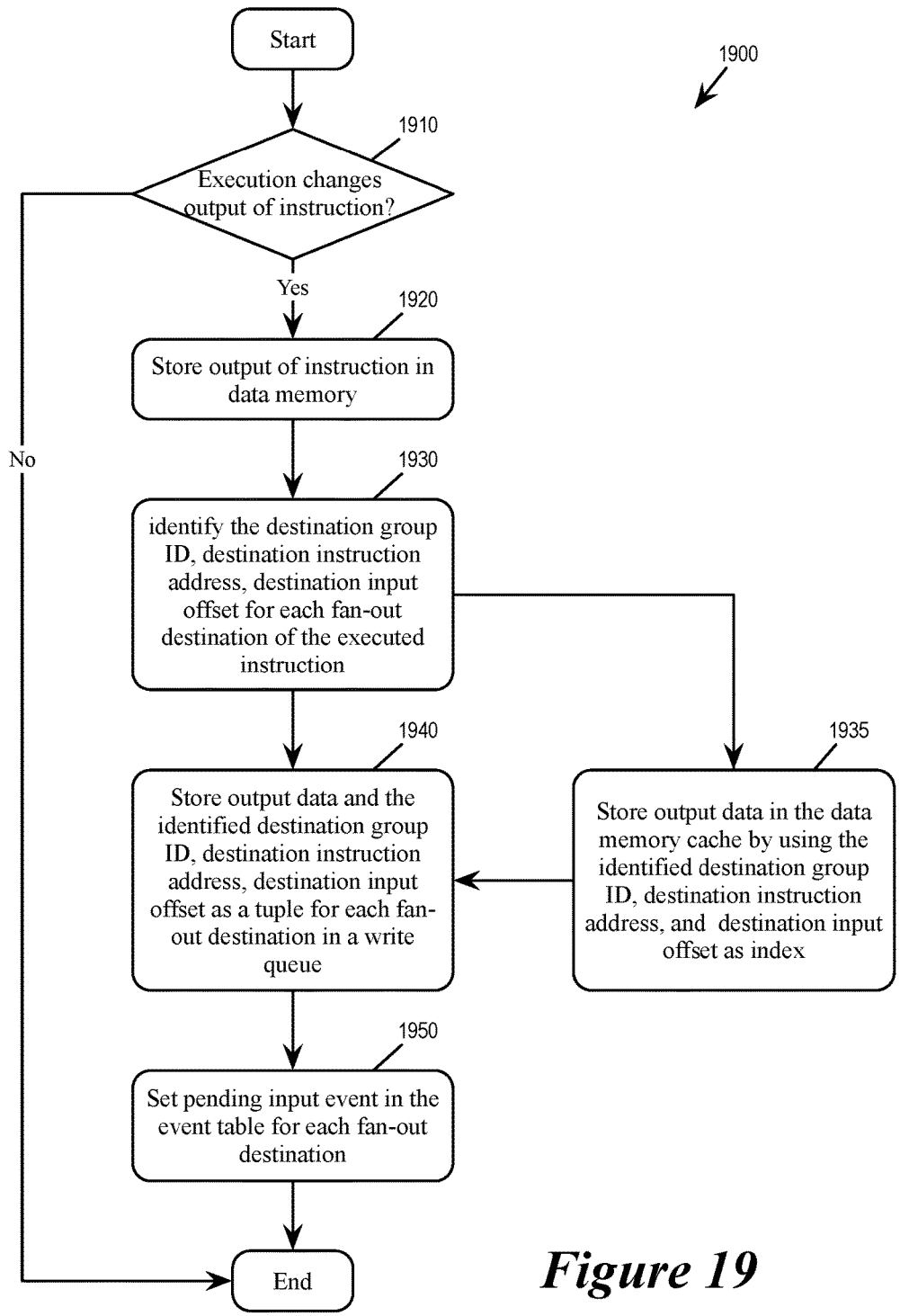
FIG. 19 conceptually illustrates a process for writing output data of an executed instruction to its fan-out locations.

FIG. 19 conceptually illustrates a process 1900 for writing output data of an executed instruction to its fan-out locations. In some embodiments, the simulation accelerator performs the process 1900 as part of the operation 1860 to write the output of the executed instruction to its fan-out destination locations.

The process 1900 starts when the simulation accelerator 110 has completed execution of an instruction and produced an output. The process determines (at 1910) whether the execution of the instruction changes the output of the instruction. In order to eliminate unnecessary write operations, the simulation accelerator in some embodiments propagates the output data of an executed instruction only when the output data has changed from previous execution of the instruction. If the output has changed, the process proceeds to 1920. If the output has not changed, the process 1900 ends without writing to the data memory.

At 1920, the process stores the output of the instruction in the data memory so the simulation accelerator may determine whether a future execution of the instruction has changed the output of the instruction.

The process 1900 identifies (at 1930) the group ID, the instruction address, and the input offset for each fan-out destination of the instruction. These information are available in the instruction memory 310 as part of the output specification 1630 portion of the instruction, which also specifies how many fan-out destinations that the instruction has.

The process 1900 stores (at 1940), for each fan-out destination, the identified group ID, the instruction address, and the input offset as a tuple with the output data into the write queue (e.g., 1520). The content of the write queue will be moved into the data memory later. For some embodiments in which the simulation accelerator uses a data memory cache to store output data from recently executed instructions, the process also stores output data into the data memory cache by using the identified group ID, instruction address, and input offset as index.

Next, the process 1900 sets (at 1950) pending input event in the event table for each fan-out destination. The process 1900 then ends.

As mentioned, in some embodiments, the instruction memory 310 and the data memory 320 are implemented by using DRAMs in order to increase data density and to lower cost. Since DRAMs are divided into pages, the simulation accelerator queues data write operations so the actual writes to the data memory can take place later with smaller page-change penalties. In some other embodiments, the instruction memory 310 and the data memory 320 are implemented by using static RAMs that do not have pages. The simulation accelerator in some of these embodiments do not queue data write operations before writing the output data into the data memory 320.

Figure 20:
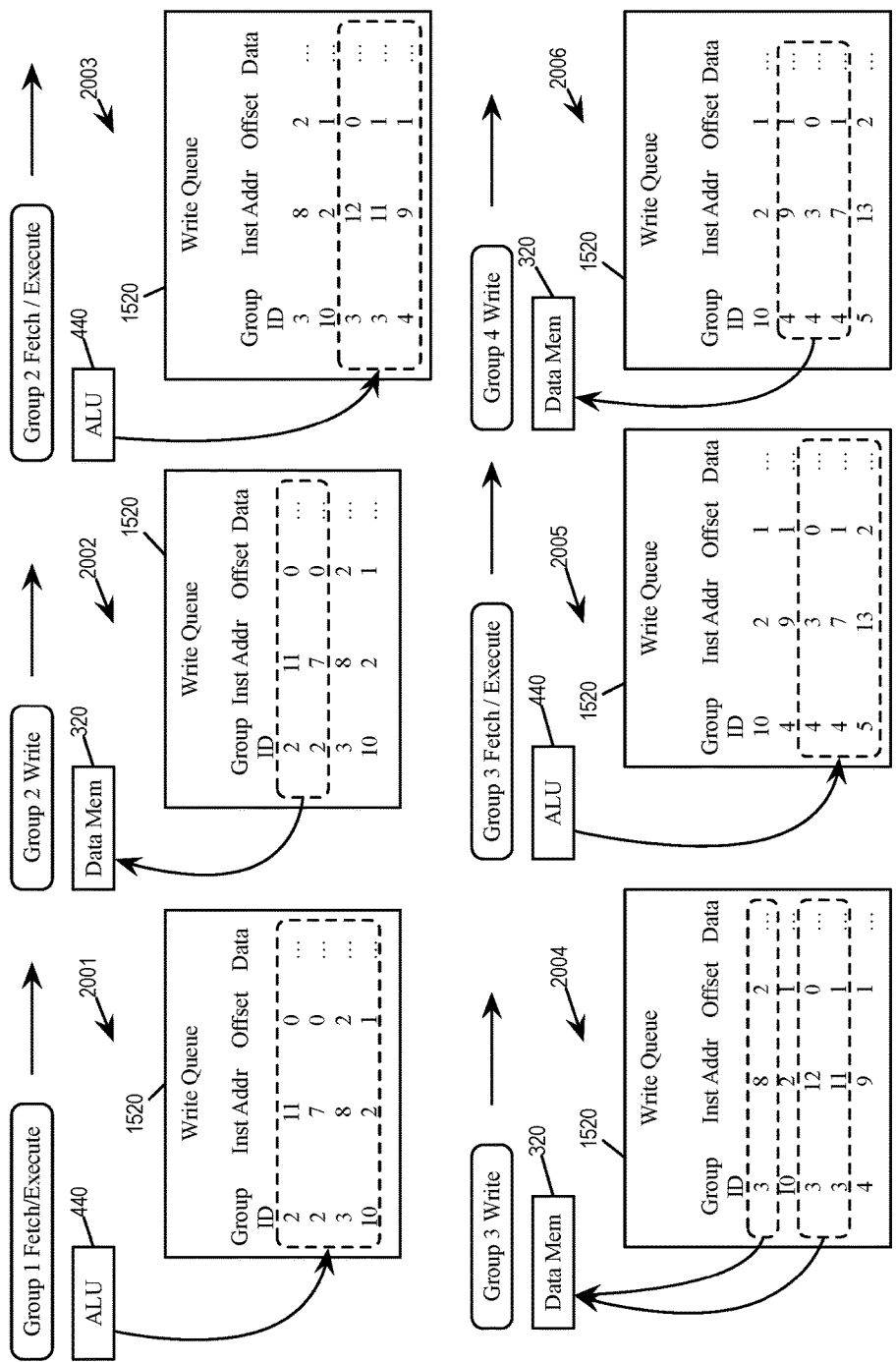
FIG. 20 conceptually illustrates the queuing of output data write operations that are generated by execution of instructions.

FIG. 20 conceptually illustrates the queuing of output data write operations that are generated by execution of instructions. In six stages 2001-2006, the figure illustrates the generation of write operations, the storing of write operations at the write queue 1520, and the moving of the output data from the write queue 1520 to the data memory 320. Though not illustrated, in some embodiments, each output data is also written into the data memory cache 325 so it will be immediately ready for retrieval by upcoming groups.

The first stage 2001 shows the ALU 440 executing fetched instructions for group 1. The execution of each instruction generates output data destined for one or more fan-out destinations. For each fan-out destination, the simulation accelerator generates an n-tuple that includes group ID, instruction address, input offset, and output data. The n-tuple is stored in the write queue 1520. The n-tuple is also stored in the data memory cache 325 so it can be retrieved quickly for the upcoming groups. As illustrated, the execution of the instructions of group 1 has generated write operations for at least four fan-out destinations. These fan-out destinations include instructions in groups 2, 3, and 10.

The second stage 2002 shows the moving of the output data from the write queue 1520 to the data memory 320. For each queued n-tuple of an output data write operation, the simulation accelerator uses the group ID, instruction address, and input offset as write address to write to the data memory 320.

The simulation accelerator may have a limited window for moving the queued write operations into the data memory. In some embodiments, the simulation accelerator would therefore move output data needed by the next group of instructions first. In this example, the simulation accelerator has identified group 2 as the next group of instructions to be executed. The accelerator hence moves the output data destined for group 2 from the write queue 1520 into the data memory 320 (since these are the output data that will be needed for execution). Some embodiments move other queued output data into the data memory as well if doing so would not affect the performance of the simulation accelerator.

The third stage 2003 shows the fetching and execution of the instructions of group 2. For some embodiments in which output data of each instruction is stored in the data memory cache 1520, the inputs of the upcoming group of instructions are already available in the cache so the fetching and execution of instructions can proceed without waiting for the updated input data to be moved into the data memory 320 from the write queue 1520.

For some embodiments in which there is no data memory cache, the fetching and execution of instructions has to wait for updated input data to be stored into the data memory 320 from the write queue 1520. Once the updated input data for group 2 instructions have all been moved into the data memory from the write queue, the instructions of group 2 can safely execute. The execution of the instructions of group 2 produces several more write operations, including at least three fan-out destinations in groups 3 and 4. These outputs are written into the write queue 1520 and/or the data memory cache 325.

The fourth stage 2004 shows the writing of the output data from the write queue 1520 to the data memory 320. Since the simulation accelerator has identified group 3 as the next group of instructions to be executed, the accelerator moves the output data destined for group 3 from the write queue 1520 into the data memory 320.

The fifth stage 2005 shows the fetching and execution of the instruction of group 3. Since the output data of destinations in group 3 have either all been moved into the data memory in stage 2004 from the write queue 1520 or is available in the data memory cache 325, the instructions in group 3 would execute with up-to-date input data. The execution produces several more write operations, including at least three fan-out destinations in groups 4 and 5. These outputs are written into the write queue 1520 and/or the data memory cache 325.

The sixth stage 2006 shows the writing of the output data from the write queue 1520 to the data memory 320. Since the simulation accelerator has identified group 4 as the next group of instructions to be executed, it moves the output data destined for group 4 from the write queue 1520 into the data memory 320.

Figure 21:
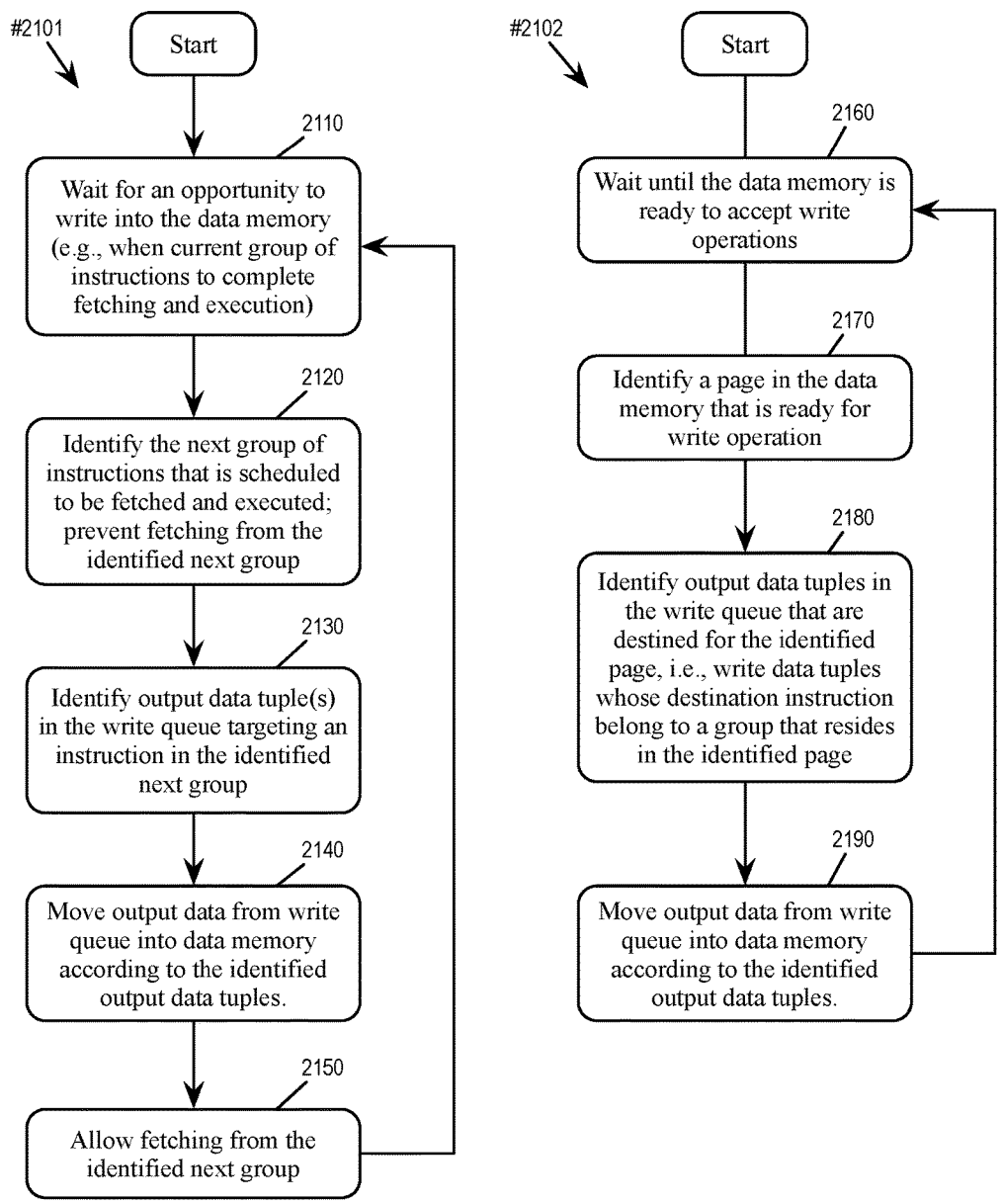
FIG. 21 conceptually illustrates processes for moving output data from the write queue to the data memory.

FIG. 21 conceptually illustrates two processes 2101 and 2102 for moving output data from the write queue to the data memory. In some embodiments, the simulation accelerator performs the processes 2101 and 2102 at the data access unit 420. For some embodiments in which the simulation accelerator does not employ a data memory cache, the simulation accelerator performs the process 2101 for moving output data from the write queue 1520 into the data memory 320 in order to ensure that the input data needed by the next group of instructions will be ready. For some embodiments in which the outputs of instruction execution are also stored in a data memory cache (as discussed above by reference to FIG. 15), the simulation accelerator 110 does not perform the process 2101 but instead perform the process 2102 to move output data from the write queue 1520 into the data memory 320 whenever the data memory is ready to accept write operations into a particular page.

The process 2101 starts whenever there are output data n-tuples waiting in the write queue to be written into the data memory. The process starts by waiting (at 2110) for an opportunity to write into the data memory. For some embodiments in which the data memory is implemented by DRAM, the process would wait for a current burst of read access to complete before moving data from the write queue to the data memory.

Next, the process 2101 identifies (at 2120) the next group of instructions scheduled to be executed. The next group of instructions will need input data at the data memory in order to execute. In some embodiments, the process also sets the necessary control to prevent the fetching of the next group of instructions until the data access unit has completed transporting output data from the write queue to the input area of the instructions of the next group.

The process 2101 next identifies (at 2130) output data tuple(s) in the write queue that are destined for the identified next group. Each output data tuple represents a fan-out write operation to an input of a destination instruction. Each output data tuple is an n-tuple that includes the group ID, the instruction address, and the input offset of the destination, along with the output data.

The process 2101 then moves (at 2140) output data from the write queue into the data memory according to identified output data n-tuples. Specifically, for each identified output data tuple, the process writes the output data of the n-tuple at a location addressed by the group ID, the instruction address, and the input offset of the n-tuple. This would write all output data destined for the identified next group of instructions into the data memory and ready for execution. The process then allows (at 2150) fetching of instructions for the identified next group since the inputs to those instructions are ready. The process 2101 then returns to 2110.

In some embodiments, the process 2101 would continue to move output data destined for other groups from the write queue into the data memory in the background if it does not interfere with other memory access operations.

The process 2102 starts by waiting (at 2160) until the data memory is ready to accept write operations. In some embodiments, the data memory has only one port and can only perform either read operation or write operation but not at the same time. The process 2102 in some of these embodiments wait until the data memory is not performing read operations. The process 2102 then identifies (at 2170) a page in the data memory that is ready for write operations. This is usually the current page that the instruction/data fetching unit is currently fetching instructions and input data from.

Next, the process 2102 identifies (at 2180) output data tuples in the write queue that are destined for the identified page, i.e., output data tuples whose destination instructions belong to a group that resides in the identified page in the DRAM. As mentioned above, each group of instructions is confined to a page in the DRAM.

The process 2102 then moves (at 2190) the identified output data tuples from the write queue to the data memory. Specifically, for each identified output data tuple, the process writes the output data of the tuple at a location addressed by the group ID, the instruction address, and the input offset of the tuple. The process 2102 then returns to 2160.

E. Instrumentation

Instrumentation presents a challenge for traditional hardware emulators. For hardware emulators, changing the set of observed nodes often forces recompilation, because the instrumentation for trace capture may require configuration of routing resources that are already configured to emulate hardware components. This greatly hampers debugging process since the design engineer often has to wait for re-compilation and re-simulation merely to add observability into the testbench or the DUT RTL.

In some embodiments, the simulation accelerator provides the content of the data memory to the host machine to provide observability into the RTL being simulated. Since the content of the data memory records the input data to each instruction of the simulated RTL, these data are already available for observation without recompilation of the testbench. In some of these embodiments, the content of the data memory is periodically dumped out to a mass storage (e.g., the simulation storage 135 or the host storage 130) so they can be available for observation or viewing at the host computer system 190.

Figure 22:
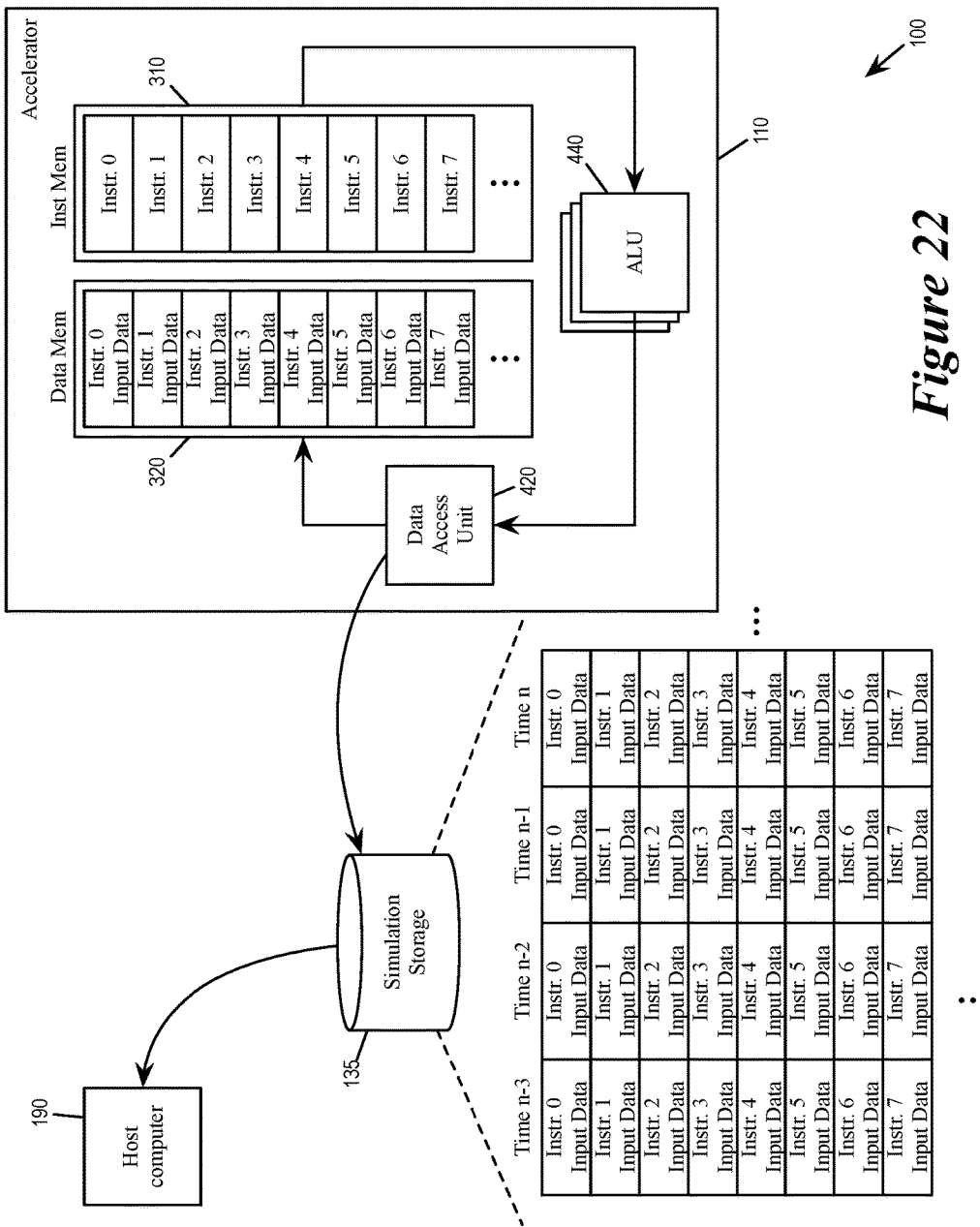
FIG. 22 illustrates instrumentation by the simulation system.

FIG. 22 illustrates instrumentation by the simulation system 100. As illustrated, the simulation accelerator 110 of the simulation system 100 is performing a simulation to test a DUT RTL. The simulation is based on instructions stored in the instruction memory 310 and input data stored in data memory 320. The ALUs 440 executes the instructions and store the outputs of the instructions back to the data memory as inputs for other instructions. The data access unit 420 manages the writing of output data into the data memory 320 and also the dumping out of instrumentation data to the simulation storage 135. In some embodiments, the data access unit 420 periodically dumps out the content of the data memory as instrumentation data into the simulation storage 135, such as whenever the simulation accelerator has completed executing a group of instructions. In some embodiments, the data access unit 420 intercepts the outputs of instructions being written to the data memory 320 and dumps them as instrumentation data to the simulation storage 135. The dump out stored in the simulation storage 135 includes inputs to different instructions at different simulation time steps.

In some embodiments, the instrumentation data is transported to the host computer as simulation result (185) so the host computer 190 can present the instrumentation data to the user for design verification.

IV. Electronic System

Figure 23:
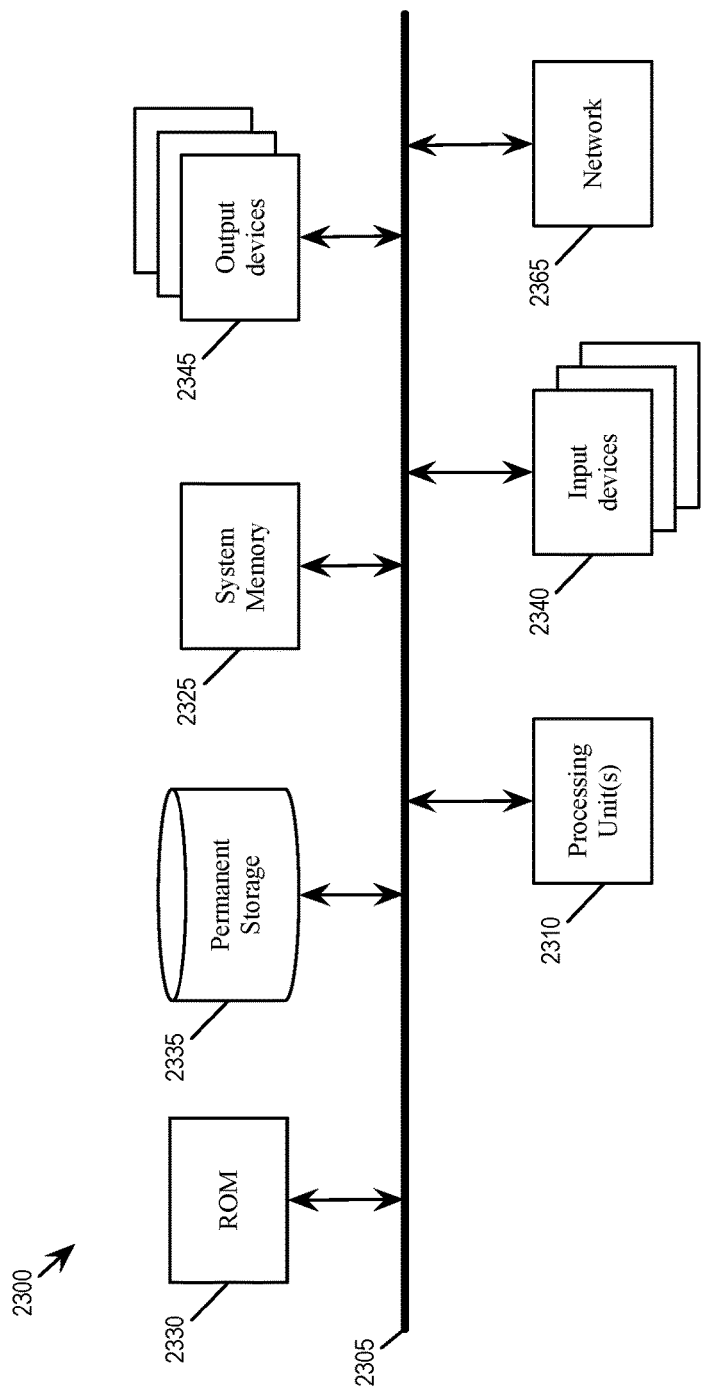
FIG. 23 conceptually illustrates an electronic system with which some embodiments of the invention are implemented.

FIG. 23 conceptually illustrates an electronic system 2300 with which some embodiments of the invention are implemented. The electronic system 2300 can be used to execute any of the control, virtualization, or operating system applications described above. The electronic system 2300 may be a computer (e.g., a desktop computer, personal computer, tablet computer, server computer, mainframe, a blade computer etc.), phone, PDA, or any other sort of electronic device. Such an electronic system includes various types of computer readable media and interfaces for various other types of computer readable media. Electronic system 2300 includes a bus 2305, processing unit(s) 2310, a system memory 2325, a read-only memory 2330, a permanent storage device 2335, input devices 2340, and output devices 2345.

The bus 2305 collectively represents all system, peripheral, and chipset buses that communicatively connect the numerous internal devices of the electronic system 2300. For instance, the bus 2305 communicatively connects the processing unit(s) 2310 with the read-only memory 2330, the system memory 2325, and the permanent storage device 2335.

From these various memory units, the processing unit(s) 2310 retrieves instructions to execute and data to process in order to execute the processes of the invention. The processing unit(s) may be a single processor or a multi-core processor in different embodiments.

The read-only-memory (ROM) 2330 stores static data and instructions that are needed by the processing unit(s) 2310 and other modules of the electronic system. The permanent storage device 2335, on the other hand, is a read-and-write memory device. This device is a non-volatile memory unit that stores instructions and data even when the electronic system 2300 is off. Some embodiments of the invention use a mass-storage device (such as a magnetic or optical disk and its corresponding disk drive) as the permanent storage device 2335.

Other embodiments use a removable storage device (such as a floppy disk, flash drive, etc.) as the permanent storage device. Like the permanent storage device 2335, the system memory 2325 is a read-and-write memory device. However, unlike storage device 2335, the system memory is a volatile read-and-write memory, such a random access memory. The system memory stores some of the instructions and data that the processor needs at runtime. In some embodiments, the invention's processes are stored in the system memory 2325, the permanent storage device 2335, and/or the read-only memory 2330. From these various memory units, the processing unit(s) 2310 retrieves instructions to execute and data to process in order to execute the processes of some embodiments.

The bus 2305 also connects to the input and output devices 2340 and 2345. The input devices enable the user to communicate information and select commands to the electronic system. The input devices 2340 include alphanumeric keyboards and pointing devices (also called "cursor control devices"). The output devices 2345 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 23, bus 2305 also couples electronic system 2300 to a network 2365 through a network adapter (not shown). In this manner, the computer can be a part of a network of computers (such as a local area network ("LAN"), a wide area network ("WAN"), or an Intranet, or a network of networks, such as the Internet. Any or all components of electronic system 2300 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. In addition, a number of the figures (including FIGS. 17, 18, 19, and 21) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

What is claimed is:

1. A method comprising:
    receiving a specification of a digital circuit, the specification comprising a plurality of instructions that are sorted into a plurality of groups of instructions, wherein each instruction belonging to a group of instructions is logically and temporally independent of any other instruction belonging to the group of instructions, wherein a first instruction in a first group is logically dependent on a second instruction in a second group;
    selecting a group of instructions; and
    executing the selected group of instructions by executing instructions in the selected group in parallel and in any order by using multiple hardware computing resources.

2. The method of claim 1, wherein executing the group of instructions comprises identifying and executing instructions having pending input events.

3. The method of claim 2, wherein executing an instruction having a pending input event comprises computing an output value based on a current set of input data of the instruction and clearing the pending input event.

4. The method of claim 1, wherein executing a particular instruction in the selected group of instructions comprises identifying a destination instruction in another group of instructions that receives a fan-out of the particular instruction and setting a pending event for an input of the destination instruction.

5. The method of claim 1, wherein the selected group of instructions is a first group of instructions, the method further comprising selecting and executing a second group of instructions after completing execution of the first group of instructions.

6. The method of claim 1, wherein executing the selected group of instructions comprises distributing multiple instructions of the selected group to the multiple computing resources based on projected execution time of each instruction.

7. The method of claim 1, wherein executing the selected group of instructions comprises distributing multiple instructions of the selected group to the multiple computing resources based on load balancing among the multiple computing resources.

8. The method of claim 1, wherein selecting the group of instructions comprises identifying a group of instructions having pending input events.

9. An integrated circuit (IC) comprising:
    an instruction memory storing a plurality of instructions that are sorted into a plurality of groups, wherein each instruction belonging to a group of instructions is logically and temporally independent of any other instruction belonging to the group, wherein a first instruction in a first group is logically dependent on a second instruction in a second group;
    a data memory storing input data for the plurality of instructions;
    an array of arithmetic processing units (ALUs) configured to execute the plurality of instructions; and
    a fetching circuit configured to fetch instructions from the instruction memory for execution at the array of ALUs, wherein the fetching circuit fetches a group of instructions from the plurality of groups of instructions and the array of ALUs execute instructions in the fetched group of instructions in parallel and in any order.

10. The IC of claim 9 further comprises an event manager circuit configured to select the group of instructions by identifying an instruction having a pending input event.

11. The IC of claim 10, wherein the event manager circuit clears the pending input event of the identified instruction upon execution of the instruction.

12. The IC of claim 9, wherein an ALU executes a current instruction by computing an output value based on a current set of input data of the current instruction, wherein the output value is used as input to a destination instruction in another group of instructions that receives a fan-out of the current instruction.

13. The IC of claim 9, wherein the fetched group of instructions is a first group of instructions, wherein the fetching circuit fetches a second group of instructions after the array of ALUs completes execution of the first group of instructions.

14. The IC of claim 9, wherein the fetched instructions of the fetched group of instructions are distributed among the ALUs in the array of ALUs based on projected execution time of each instruction.

15. The IC of claim 9, wherein the fetched instructions of the fetched group of instructions are distributed among the ALUs in the array of ALUs based on load balancing among the ALUs in the array of ALUs.

16. A simulation system comprising:
a simulation processor configured to execute a set of compiled models to generate stimulus for testing a design of a digital circuit; and
a simulation accelerator comprising a plurality of sets of hardware computing resources configured to execute a plurality of instructions emulating a behavior of the digital circuit by applying the generated stimulus,
wherein the plurality of instructions are sorted into a plurality of groups of instructions, wherein each instruction belonging to a group of instructions is logically and temporally independent of any other instruction belonging to the group of instructions, wherein a first instruction in a first group is logically dependent on a second instruction in a second group, wherein the simulation accelerator selects a group of instructions and executes the selected group of instructions by executing instructions in the selected group in parallel and in any order by using the plurality of sets of hardware computing resources.

17. The simulation system of claim 16, wherein the selected group of instructions is a first group of instructions, wherein the simulation accelerator selects and executes a second group of instructions after completing execution of the first group of instructions.

18. The simulation system of claim 16, wherein executing the selected group of instructions comprises distributing multiple instructions of the selected group to the plurality of sets of computing resources based on projected execution time of each instruction.

19. The simulation system of claim 16, wherein executing the selected group of instructions comprises distributing multiple instructions of the selected group to the plurality of sets of computing resources based on load balancing among the plurality sets of computing resources.

20. The simulation system of claim 16, wherein selecting the group of instructions comprises identifying a group of instructions having pending input events.

* * * * *